United States Patent
Kaneko et al.

(10) Patent No.: US 10,124,681 B2
(45) Date of Patent: Nov. 13, 2018

(54) RAILWAY VEHICLE POWER CONVERTER

(71) Applicant: Fuji Electric Co., Ltd., Kanagawa (JP)

(72) Inventors: Kimihisa Kaneko, Kanagawa (JP); Yoshihisa Uehara, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/475,511

(22) Filed: Mar. 31, 2017

(65) Prior Publication Data

US 2017/0341521 A1    Nov. 30, 2017

(30) Foreign Application Priority Data

May 31, 2016  (JP) ................. 2016-108355
Dec. 16, 2016  (JP) ................. 2016-244909
Mar. 13, 2017  (JP) ................. 2017-047672

(51) Int. Cl.
*H05K 7/20* (2006.01)
*B60L 11/18* (2006.01)
*H01L 23/473* (2006.01)

(52) U.S. Cl.
CPC ...... *B60L 11/1812* (2013.01); *H05K 7/20145* (2013.01); *H05K 7/20418* (2013.01); *H05K 7/20909* (2013.01); *B60L 2200/26* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| | | | |
|---|---|---|---|
| 6,181,556 B1 * | 1/2001 | Allman | G06F 1/20 165/185 |
| 2006/0012320 A1 * | 1/2006 | Kumar | B60L 7/06 318/376 |
| 2006/0028075 A1 * | 2/2006 | Noda | H02K 5/10 310/64 |

(Continued)

FOREIGN PATENT DOCUMENTS

JP    3469475 B2    11/2003

*Primary Examiner* — Anthony M Haughton
*Assistant Examiner* — Razmeen Gafur
(74) *Attorney, Agent, or Firm* — Chen Yoshimura LLP

(57) ABSTRACT

A power converter for a railway vehicle includes a power converter body configured to be installed on the railway vehicle; a first radiating fin unit arranged on a front side on the power converter body for dissipating heat from the power converter body; a second radiating fin unit arranged on the power converter body on a rear side for dissipating heat from the power converter body; and an air duct that takes in air from a region other than regions in which the first and second radiating fin units are disposed while the railway vehicle is moving, the air duct extending into a fin separation space that is defined as a space between the first radiating fin unit and the second radiating fin unit so as to guide air that is taken in into the fin separation space.

18 Claims, 15 Drawing Sheets

(56) References Cited

U.S. PATENT DOCUMENTS

| | | | |
|---|---|---|---|
| 2007/0273220 A1* | 11/2007 | Koyama | H02K 5/20 310/58 |
| 2008/0030086 A1* | 2/2008 | Noda | B61C 9/50 310/57 |
| 2009/0095195 A1* | 4/2009 | Kumar | B61C 15/04 105/96 |
| 2010/0157531 A1* | 6/2010 | Mason | H01Q 1/02 361/697 |
| 2011/0100253 A1* | 5/2011 | Koyama | F04D 25/105 105/34.1 |
| 2012/0012294 A1* | 1/2012 | Miki | B61C 17/00 165/185 |
| 2012/0050993 A1* | 3/2012 | Suzuki | H05K 7/20936 361/700 |
| 2013/0141867 A1* | 6/2013 | Zhou | H05K 7/20127 361/691 |
| 2013/0312937 A1* | 11/2013 | Tsukinari | H01L 23/427 165/104.21 |
| 2014/0042611 A1* | 2/2014 | Kominami | H01L 23/36 257/713 |
| 2014/0160811 A1* | 6/2014 | Wong | B60L 9/24 363/36 |
| 2014/0211531 A1* | 7/2014 | Yamashita | H02M 7/003 363/141 |
| 2015/0016171 A1* | 1/2015 | Yasuda | H05K 7/20936 363/141 |
| 2015/0049436 A1* | 2/2015 | Wu | H05K 7/20163 361/697 |
| 2015/0062811 A1* | 3/2015 | Suzuki | B61C 3/00 361/690 |
| 2015/0222201 A1* | 8/2015 | Nakashima | H02M 7/487 363/131 |
| 2015/0225000 A1* | 8/2015 | Okada | B60L 11/12 701/19 |
| 2016/0134177 A1* | 5/2016 | Itoh | H02K 9/12 105/59 |
| 2016/0192539 A1* | 6/2016 | Sugita | H05K 7/20927 361/699 |
| 2016/0229421 A1* | 8/2016 | Periot | B60L 3/003 |
| 2016/0241136 A1* | 8/2016 | Nakashima | H02M 1/44 |
| 2017/0033711 A1* | 2/2017 | Matsuda | H02M 5/4585 |

* cited by examiner

RAILWAY VEHICLE POWER CONVERTER

BACKGROUND OF THE INVENTION

Technical Field

The present invention relates to a railway vehicle power converter, and more particularly to a railway vehicle power converter that includes a plurality of radiating fins for dissipating heat from components of a railway vehicle while the railway vehicle is moving.

Background Art

Railway vehicle power converters that include a plurality of radiating fins for dissipating heat from components of a railway vehicle while the railway vehicle is moving are a well-known technology (see Patent Document 1, for example).

Patent Document 1 discloses a railway vehicle semiconductor heat sink device that includes a plurality of heat sinks (radiating fins) used in a vehicle-driving power converter that is mounted under the floor of a railway vehicle. In the railway vehicle semiconductor heat sink device disclosed in Patent Document 1, in a space under the floor of the vehicle, the heat sinks (radiating fins) are arranged in lines in the horizontal direction on the side faces of the power converter and divided into three groups in the vehicle movement direction. Moreover, the outer sides of these heat sink groups are covered by a protective cover in which a large number of air holes are formed. Inside the protective cover, air-guiding plates are formed slanting towards each side of the heat sinks. In this way, the airflow created while the vehicle is moving is taken in through the air holes in the protective cover and then directly or partially flows along the air-guiding plates and is supplied to the heat sinks (radiating fins).

RELATED ART DOCUMENT

Patent Document

Patent Document 1: Japanese Patent No. 3469475

SUMMARY OF THE INVENTION

However, in the railway vehicle semiconductor heat sink device disclosed in Patent Document 1, although the airflow is taken in through the large number of air holes in the protective cover and is then supplied to the individual heat sinks (radiating fins) by the air-guiding plates, the complex flow pattern inside of the protective cover resulting from the relative positioning of the individual heat sinks and the locations at which the air-guiding plates are attached can potentially result in situations in which not all of the airflow that enters the protective cover is supplied to the heat sinks. Moreover, when some of the air that enters the protective cover simply passes through and is exhausted through the large number of air holes in the protective cover to back outside of the protective cover without being used for heat exchange with the heat sinks, the airflow supplied (guided) to the individual heat sinks becomes insufficient, and it is not possible to maximize the heat dissipation performance of the heat sinks. This results in a decrease in the overall heat dissipation performance of the heat sinks.

The present invention was made to solve the abovementioned problems, and one object of the present invention is to provide a railway vehicle power converter that makes it possible to improve the overall heat sink performance (heat dissipation performance) of a heat sink unit that includes a plurality of radiating fins. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a power converter for a railway vehicle, including: a power converter body configured to be installed on the railway vehicle; a first radiating fin unit arranged on a front side with respect to a movement direction of the railway vehicle on the power converter body, the first radiating fin unit having a plurality of fins each extending in the movement direction and dissipating heat from the power converter body; a second radiating fin unit arranged on the power converter body on a rear side, separated from the first radiating fin unit by a prescribed distance, the second radiating fin unit having a plurality of fins each extending in the movement direction and dissipating heat from the power converter body; and an air duct that takes in air from a region other than regions in which the first and second radiating fin units are disposed while the railway vehicle is moving, the air duct extending into a fin separation space that is defined as a space between the first radiating fin unit and the second radiating fin unit so as to guide air that is taken in into the fin separation space.

As described above, the railway vehicle power converter according to this aspect of the present invention includes the air duct that takes in air from a region outside the first radiating fins and the second radiating fins while the railway vehicle is moving and extends into the fin separation region between the first radiating fins and the second radiating fins so as to guide air that is taken in into the fin separation region. In this way, when the railway vehicle is traveling with the first radiating fins on the forward side (the upstream side), for example, the airflow (fresh outside air) taken in from the region outside the first radiating fins and the second radiating fins can be brought through the air duct and reliably guided into the fin separation region between the first radiating fins and the second radiating fins. Furthermore, the air (airflow) that is guided into the fin separation region can be reliably (and sufficiently) supplied to the rearward (downstream) second radiating fins, thereby making it possible to maintain the heat dissipation performance of the second radiating fins at the same level as the heat dissipation performance of the upstream first radiating fins. This makes it possible to maximize the heat dissipation performance of the individual radiating fins (the first radiating fins and the second radiating fins), thereby making it possible to improve the overall heat sink performance (heat dissipation performance) of a heat sink unit of the railway vehicle.

In the railway vehicle power converter according to the aspect described above, it is preferable that the first radiating fin unit and the second radiating fin unit each include a base fixed to a surface of the power converter body, the base supporting and attaching edges of the respective plurality of fins, and that the air duct include, in the fin separation space, a duct that has an elongated shape with a height lower than or equal to a height of the respective bases, the duct having an opening that creates an outlet in a surface of the duct so as to exhaust air in the duct outwardly into the fin separation space. Here, because the protrusion height of the duct is less than or equal to the protrusion height of the bases, the duct does not protrude out between the plurality of fins of the first radiating fins and the plurality of fins of the second radiating fins in the fin separation region, thereby making it possible to easily allocate a passage (space) for the air in the fin separation region. Therefore, the airflow (fresh outside air) exhausted from the outlet is diffused downwards into the fin separation region and can be effectively supplied to the fins (of the first radiating fins or the second radiating fins) that are currently rearward (downstream) according to the movement direction of the railway vehicle.

In the configuration described above in which the air duct includes the duct and the outlet, it is preferable that the duct be attached to a portion of the surface of the power converter body to which the respective bases are fixed. This makes it possible to easily arrange the duct that has a protrusion height of less than or equal to the protrusion height of the bases so as to extend along the surface of the main power converter unit and into the fin separation region.

In the configuration described above in which the air duct includes the duct and the outlet, it is preferable that, in the fin separation space, the duct extend in a direction that is orthogonal to the movement direction. This makes it possible to guide the airflow (fresh outside air) that is taken in from the region outside the first radiating fins and the second radiating fins through the duct and into the fin separation region across a wide region (range) that extends from the end sides to the center side in the direction that is orthogonal to the movement direction.

In the configuration described above in which the air duct includes the duct and the outlet, it is preferable that the outlet in the duct substantially span from one end of the fin separation space to another end of the fin separation space in a direction that is orthogonal to the movement direction and that is parallel to the surface of the power converter body to which the respective bases are fixed. This makes it possible to exhaust the airflow (fresh outside air) that is taken in from the region outside the first radiating fins and the second radiating fins through the outlet and into the fin separation region across a wide range that spans from near the one side to near the other side in the direction that is orthogonal to the movement direction. Therefore, the airflow that is diffused into the fin separation region can be uniformly supplied along the direction that is orthogonal to the movement direction to the fins (of the first radiating fins or the second radiating fins), depending on which are currently rearward (downstream) according to the movement direction of the railway vehicle.

In the configuration described above in which the air duct includes the duct and the outlet, it is preferable that the outlet be slit-shaped and extend in a direction in which the duct extends. This makes it possible to exhaust the airflow that is taken in from the region outside the first radiating fins and the second radiating fins through the slit-shaped outlet and into the fin separation region in an air curtain-shaped flow pattern. Therefore, this air curtain-shaped airflow can be uniformly supplied along the direction that is orthogonal to the movement direction from near the one side to near the other side of the fins that are currently rearward (downstream) according to the movement direction of the railway vehicle.

In the configuration described above in which the air duct includes the duct and the outlet, it is preferable that the outlet be formed of a plurality of slits that are arranged in a direction in which the duct extends and that are separated from one another by a prescribed interval. This makes it possible to adjust parameters such as the number and positioning of the outlets in accordance with the length of the duct that extends through the fin separation region, thereby making it possible to shape the flow pattern of the airflow that is exhausted into the fin separation region from the outlets to have a desired shape.

It is preferable that the configuration described above in which the air duct includes the duct and the outlet further include an air-guiding plate configured so as to guide air that is exhausted through the outlet into the fin separation space towards a lateral end of the first radiating fin unit or the second radiating fin unit that is adjacent to the outlet. This makes it possible to use the first air-guiding plate to efficiently and reliably guide the airflow (fresh outside air) to the movement direction-side ends of the fins that are currently rearward (downstream) according to the movement direction of the railway vehicle.

In the configuration described above in which the air duct includes the duct and the outlet, it is preferable that the air duct further include an inlet that takes in air from a space that is located outside of the fin separation space, and that air that enters the inlet be guided into the duct, travel through the duct, and then be exhausted through the outlet outwardly into the fin separation space in a direction in which the respective plurality of fins extend from the respective bases. This makes it possible to easily take in, via the inlet, the airflow flowing along the region of the railway vehicle on the outer side of the fins (of the first radiating fins or the second radiating fins) in the direction that is orthogonal to the movement direction and also makes it possible to guide that air through the duct-shaped duct that is connected to the inlet and then collect that air in the fin separation region. Then, that air can be reliably supplied to the rearward (downstream) fins (of the first radiating fins or the second radiating fins) through the outlet that forms an opening into the fin separation region.

In this case, it is preferable that the air duct include two of the inlet that are a first inlet and a second inlet, the first inlet being configured to take in an airflow when the railway vehicle is traveling in the movement direction with the first radiating fin unit placed on the front side relative to the second radiating fin unit, the second inlet being configured to take in an airflow when the railway vehicle is traveling in a reversed direction opposite to the movement direction with the second radiating fin unit placed on a front side relative to the reversed direction, and that the air duct further include an air-guiding plate or plates configured to guide air taken in by the first inlet or the second inlet, depending on a movement direction of the railway vehicle, into the duct. In this way, the airflow that is taken in through the first inlets or the second inlets (depending on the movement direction of the railway vehicle) can be reliably supplied from the fin separation region to the rearward (downstream) fins (of the first radiating fins or the second radiating fins).

In the railway vehicle power converter according to the aspect described above, it is preferable that the air duct be formed spanning from an outer space that is located outside the fin separation space on one side of the fin separation space in a direction orthogonal to the movement direction to another outer space that is outside of the fin separation space on an opposite side. This makes it possible to reliably take in the airflow (fresh outside air) from at least one of the region on one side of the first radiating fins and the second radiating fins or the region on the other side that are positioned further outward than the fin separation region in the direction that is orthogonal to the movement direction and to then reliably guide that air into the fin separation region. Therefore, the overall heat sink performance (heat dissipation performance) of a heat sink unit of the railway vehicle can be maintained at a prescribed level without being significantly affected by the traveling conditions of the railway vehicle or the strength of the resulting airflow.

In this case, it is preferable that the air duct have inlets on respective sides of the fin separation space, respectively opening to the outer space and the another outer space so as to take in air from the outer space and the another outer space, respectively. This makes it possible to reliably prevent air that passes through and is heated by the first radiating fins or the second radiating fins while the railway vehicle is moving from being taken in again via the inlets of the air duct.

In the configuration described above in which the air duct further includes the inlets, it is preferable that the inlets be provided on respective surfaces of the power converter body that are located outside of the fin separation space; that the first radiating fin unit and the second radiating fin unit each include a base fixed to a surface of the power converter body, the base supporting edges of the respective plurality of fins; that air duct include, in the fin separation space, a duct that has an elongated shape with a height lower than or equal to a height of the respective bases; and that air that flows along the respective surfaces of the power converter body while the railway vehicle is moving be taken in via the respective inlets, and air that is taken in via the inlets be guided into the duct. This makes it possible to effectively take in the airflow (fresh outside air) that flows along the surfaces on both sides of the main power converter unit that are positioned further outwards than the fin separation region and to then effectively supply that air to the fins (of the first radiating fins or the second radiating fins) that are currently rearward (downstream) according to the movement direction of the railway vehicle.

In this case, it is preferable that lengths of the inlets along directions parallel to the respective surfaces on which the inlets are provided be greater than the height of the duct. This makes it possible to increase the opening area of the inlets, thereby making it possible to temporarily collect more of the airflow (fresh outside air) that was taken in within the duct and then vigorously exhaust the air collected in the duct into the fin separation region.

In the railway vehicle power converter according to the aspect described above, it is preferable that the air duct have a shape that is line-symmetric about a center line running through the fin separation space in a direction that is orthogonal to the movement direction. This makes it possible to reduce variation between the amounts of heat dissipated by the first radiating fins and the second radiating fins regardless of whether the railway vehicle is traveling with the first radiating fin side or the second radiating fin side in the forward direction. In other words, this makes it possible to sufficiently improve the heat sink performance of the present invention regardless of the movement direction of the railway vehicle.

In the railway vehicle power converter according to the aspect described above, it is preferable that the air duct have a shape that is line-symmetric about a center line parallel to the movement direction. This makes it possible to uniformly take in the airflow (fresh outside air) from the region positioned further outwards than the fin separation region on one side in the direction that is orthogonal to the movement direction and from the region positioned further outwards than the fin separation region on the other side and to then guide that air into the fin separation region. Therefore, the overall heat sink performance (heat dissipation performance) of a heat sink unit of the railway vehicle can be maintained at a prescribed level without being significantly affected by the traveling conditions of the railway vehicle or the strength of the resulting airflow.

In the configuration described above in which the air duct includes the duct and the outlet, it is preferable that, in the fin separation space, the duct be configured to extend in a railway tie direction that is orthogonal to the movement direction. Here, when the plurality of fins of the first radiating fins and the second radiating fins are formed extending in the vertical direction of the railway vehicle, the airflow (fresh outside air) exhausted from the outlet can be diffused into the fin separation region and can then be effectively supplied to the fins (of the first radiating fins or the second radiating fins) that are currently rearward (downstream) according to the movement direction of the railway vehicle.

In this case, it is preferable that the power converter body be configured to be mounted in an underfloor space of the railway vehicle; that the surface of the power converter body to which the first radiating fin unit and the second radiating fin unit are attached be a bottom surface of the power converter body; that the air duct be attached along the bottom surface of the power converter body to which the first radiating fin unit and the second radiating fin unit are fixed; and that the air duct be configured to guide air that is taken in from a position near the bottom surface of the power converter body or from a position further away than the position near the bottom surface while the railway vehicle is moving into the fin separation space and to then exhaust the air towards a lateral end of the first radiating fin unit or the second radiating fin unit. Here, when there is sufficient space to mount the first radiating fins and the second radiating fins beneath the main power converter unit, the first radiating fins and the second radiating fins can easily be mounted in a way that makes it possible to effectively equalize the heat sink performance (heat dissipation performance) of the first radiating fins and the second radiating fins when dissipating heat from the main power converter unit.

In the configuration described above in which the air duct includes the duct and the outlet, it is preferable that, in the fin separation space, the duct be configured to extend in a vertical direction of the railway vehicle that is orthogonal to the movement direction. Here, when the plurality of fins of the first radiating fins and the second radiating fins are formed extending in the side direction of the railway vehicle, the airflow (fresh outside air) exhausted from the outlet can be diffused into the fin separation region and can then be effectively supplied to the fins (of the first radiating fins or the second radiating fins) that are currently rearward (downstream) according to the movement direction of the railway vehicle.

In this case, it is preferable that the power converter body be configured to be mounted in an underfloor space of the railway vehicle; that the surface of the power converter body to which the first radiating fin unit and the second radiating fin unit are attached be a side face of the power converter body; that the air duct be attached along the side face of the power converter body to which the first radiating fin unit and the second radiating fin unit are fixed; and that the air duct be configured to guide air that is taken in from a position near the side face of the power converter body or from a position further away than the position near the side face while the railway vehicle is moving into the fin separation space and to then exhaust the air towards a lateral end of the first radiating fin unit or the second radiating fin unit. Here, when there is sufficient space to mount the first radiating fins and the second radiating fins on the side of the main power converter unit, the first radiating fins and the second radiating fins can easily be mounted in a way that makes it possible to effectively equalize the heat sink performance (heat dissipation performance) of the first radiating fins and the second radiating fins when dissipating heat from the main power converter unit. Moreover, here the first radiating fins and the second radiating fins are mounted on the side of the main power converter unit, and therefore the first radiating fins and the second radiating fins are exposed on the side of the railway vehicle while the railway vehicle is moving. This makes it possible to take in an airflow that is less turbulent than when taking in fresh outside air from beneath the railway vehicle (where other devices or the like may be attached), thereby making it possible for the first radiating fins and the second radiating fins to easily take in fresh outside air from the side of the railway vehicle. This, in turn, makes it possible to further improve the heat sink performance (heat dissipation performance) of a heat sink unit.

As described above, the present invention makes it possible to improve the overall heat sink performance (heat dissipation performance) of a heat sink unit that includes a plurality of radiating fins.

It is to be understood that both the foregoing general description and the following detailed description are exemplary and explanatory, and are intended to provide further explanation of the invention as claimed.

DETAILED DESCRIPTION OF EMBODIMENTS

Next, specific embodiments of the present invention will be described with reference to figures.

Embodiment 1

First, the configuration of a power converter 100 for a railway vehicle 10 according to Embodiment 1 of the present invention will be described with reference to FIGS. 1 to 5. The power converter 100 is one example of a "power converter for a railway vehicle" as described in the claims. In the following description, the movement direction of the railway vehicle 10 is defined to be the X axis direction, the direction of railway ties of a railway 1 that are orthogonal to the X axis direction is defined to be the Y axis direction, and the vertical direction that is mutually orthogonal to the X axis direction and the Y axis direction is defined to be the Z axis direction.

Figure 1:
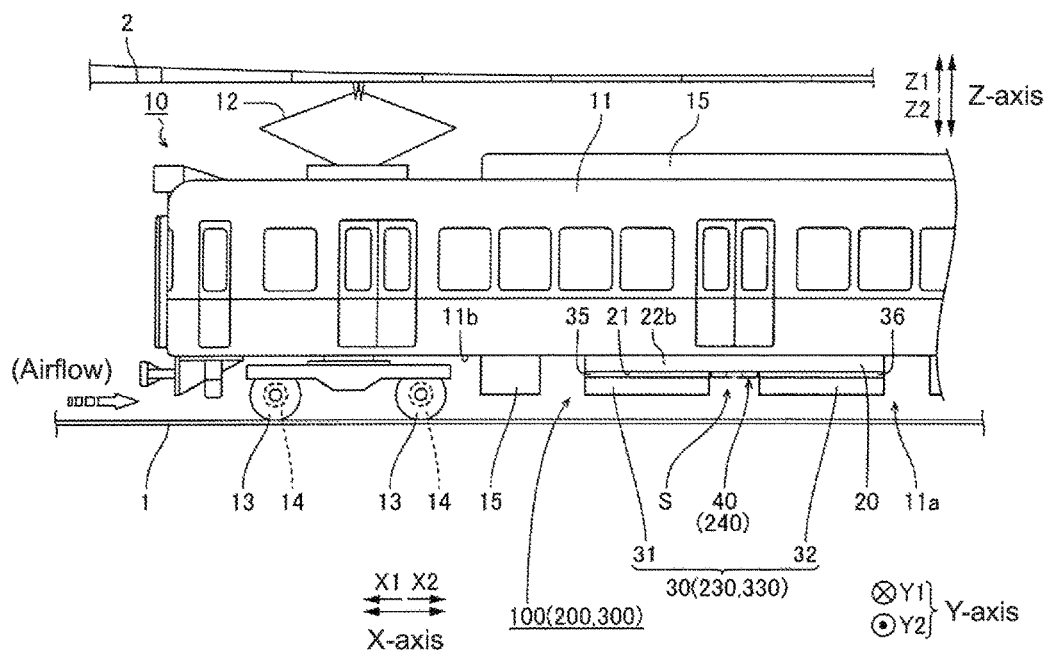
FIG. 1 is a side view illustrating a railway vehicle in Embodiment 1 of the present invention.
Figure 2:
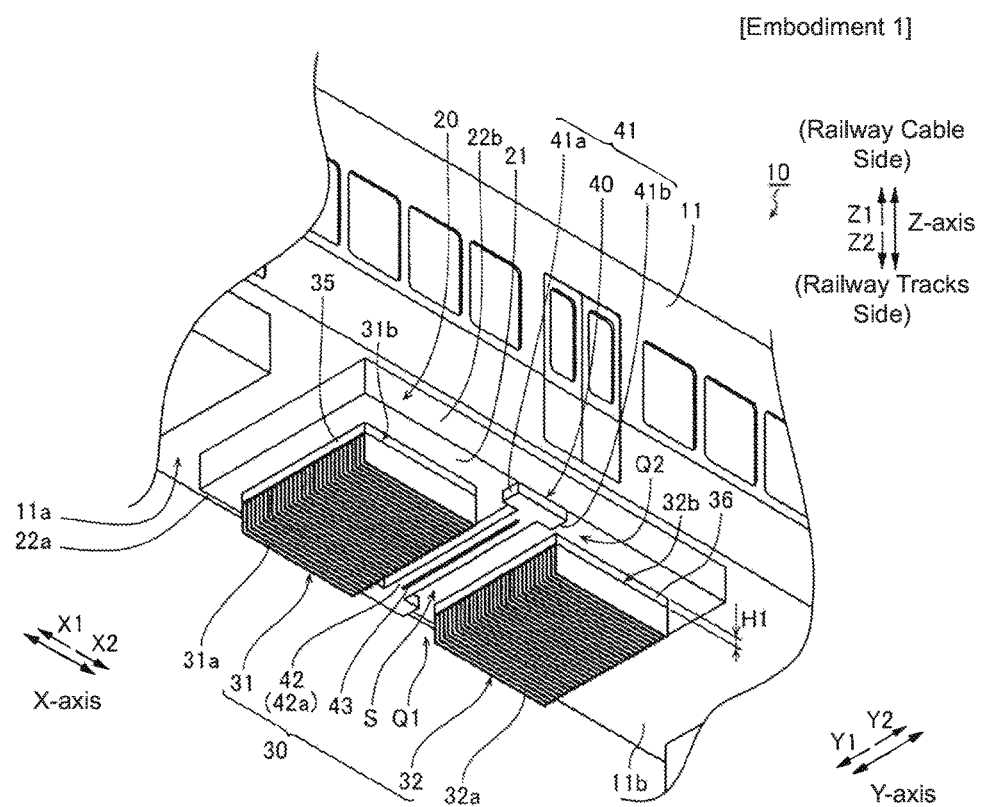
FIG. 2 is a perspective view of the railway vehicle in Embodiment 1 of the present invention as viewed from diagonally below.

As illustrated in FIGS. 1 and 2, the power converter 100 according to Embodiment 1 of the present invention is mounted in an underfloor space 11a of a vehicle body 11 of the railway vehicle 10. Here, the overall configuration of the railway vehicle 10 will be described briefly. As illustrated in FIG. 1, the railway vehicle 10 includes the vehicle body 11, a pantograph 12 that receives (collects) power supplied to an overhead line 2, induction motors 14 (illustrated by the dashed lines) that use the power from the overhead line 2 to rotate driving wheels 13, and a plurality of various other devices 15 such as an air conditioner and a controller. Moreover, while the railway vehicle 10 is moving, the power converter 100 converts the power from the overhead line 2 by switching semiconductor elements (not illustrated in the figure) and thereby controls the rotation of the induction motors 14.

(Configuration of Power Converter)

The power converter 100 includes a semiconductor device 20 for converting power and a heat sink unit 30 for radiating heat produced by semiconductor elements in the semiconductor device 20 to the outside air. Moreover, as illustrated in FIG. 2, the power converter 100 is fixed in a suspended manner to a bottom surface 11b of the vehicle body 11 in the underfloor space 11a of the vehicle body 11. Here, the semiconductor device 20 is arranged on the bottom surface 11b side (a Z1 side), and the heat sink unit 30 is arranged on the railway 1 side (a Z2 side). Furthermore, the heat sink unit 30 includes radiating fins 31 (on an X1 side) and radiating fins 32 (on an X2 side) that are arranged separated from one another by a prescribed distance in the X axis direction in which the vehicle body 11 extends. The radiating fins 31 and 32 have thin plate shapes that extend down vertically (towards the railway 1 side) from the bottom surface (Z2 side) of the semiconductor device 20 and run parallel to the X axis direction. Note that here, the semiconductor device 20 is one example of the "power converter body" as recited in the claims. Moreover, the radiating fins 31 and 32 are examples of the "first radiating fin unit" and the "second radiating fin unit" as recited in the claims, respectively.

The radiating fins 31 include a plurality of thin plate-shaped fins 31a and a base 35 to which roots of the fins 31a are connected. The radiating fins 32 include a plurality of thin plate-shaped fins 32a and a base 36 to which roots of the fins 32a are connected. The number of the fins 31a is equal to the number of the fins 32a, and the radiating fins 31 and 32 have the same overall configuration as one another. The radiating fins 31 and 32 are attached to a bottom surface 21 of the semiconductor device 20 via the bases 35 and 36, respectively. The bases 35 and 36 have a prescribed height H1 (thickness in the Z axis direction). Moreover, the radiating fins 31 and 32 are symmetric on the Y1 and Y2 sides about a center line 150 that runs in the X axis direction (the movement direction) through the center of the semiconductor device 20 in the Y axis direction (the railway tie direction). Furthermore, the radiating fins 31 and 32 are arranged separated from one another by a space S of a prescribed width in the X axis direction. Note that here, the bottom surface 21 is one example of a "surface of the power converter body" as recited in the claims. Moreover, the space S is one example of a "fin separation space" as recited in the claims. Similarly, the height H1 is one example of the "height" as recited in the claims.

As illustrated in FIG. 1, when the railway vehicle 10 travels in the X1 direction, air near the railway 1 flows in the X2 direction relative to the railway vehicle 10 and blows onto the heat sink unit 30 in the underfloor space 11a. This airflow flows in the X2 direction through gaps between the fins 31a and 32a that extend in the X axis direction (see FIG. 2). In this way, heat from the heat sink unit 30 is exhausted to the outside air. The remainder of this description assumes that the railway vehicle 10 travels in the X1 direction, that the radiating fins 31 are arranged on the upstream side (the X1 side) in the movement direction (the direction of travel), and that the radiating fins 32 are arranged on the downstream side (the X2 side) at a further rearward position.

Figure 3:
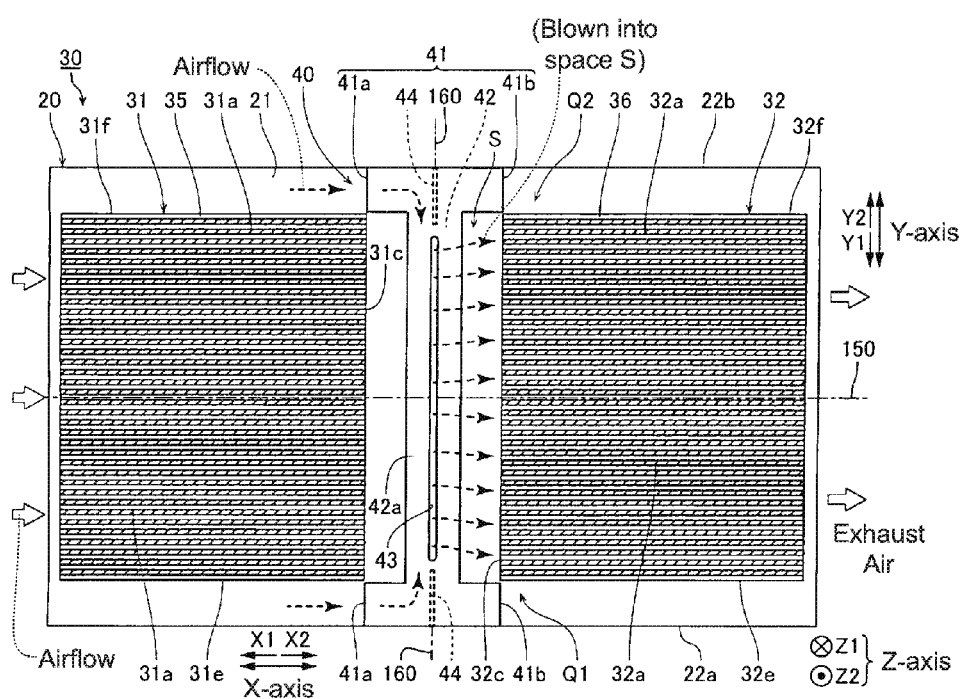
FIG. 3 illustrates a power converter according to Embodiment 1 of the present invention as viewed from below.

As illustrated in FIGS. 2 and 3, in Embodiment 1 an air duct 40 is arranged in the space S between the radiating fins 31 and the radiating fins 32. The air duct 40 is attached along the bottom surface 21 of the semiconductor device 20 to which the bases 35 and 36 is fixed. Moreover, the air duct 40 includes a pair of inlets 41, a duct 42, and an outlet 43. Next, the configuration of the air duct 40 will be described in more detail.

(Detailed Configuration of Air Duct)

As illustrated in FIG. 3, each of the inlets 41 of the air duct 40 includes a first inlet 41a that takes in the airflow when the railway vehicle 10 is traveling with the radiating fins 31 on the forward side in the movement direction as well as a second inlet 41b that takes in the airflow when the railway vehicle 10 is traveling with the radiating fins 32 on the forward side in the movement direction. Moreover, air-guiding plates 44 (illustrated by the dashed lines) are formed inside of the air duct 40 to guide the air that is taken in through the first inlets 41a or the second inlets 41b (depending on the movement direction) into the duct 42. Furthermore, the inlets 41 (the first inlets 41a and the second inlets 41b) are respectively formed in side regions Q1 and Q2 that are separated outwards from the space S on both sides (that is, in the Y1 and Y2 directions) in the railway tie direction (the Y axis direction) that is orthogonal to the movement direction (the X axis direction).

The air duct 40 is formed spanning from the side region Q1 on one side (the Y1 side) of the radiating fins 31 and 32 to the side region Q2 on the other side (the Y2 side) in the railway tie direction. In other words, the duct 42 extends through the space S in the railway tie direction and is connected to the pair of inlets 41 that are formed on both sides in the railway tie direction. Moreover, the flow paths from the first inlets 41a and the second inlets 41b that are separated from one another by the air-guiding plates 44 are joined together inside the duct 42 to form a single passage. Furthermore, the duct 42 extends through the space S with a height (height H1) that is substantially equal to the height H1 of the base 35 (see FIG. 2). The duct 42 has a rectangular cross-sectional shape. In addition, the air duct 40 that includes the inlets 41 and the duct 42 is attached along the bottom surface 21 of the semiconductor device 20 to which the base 35 is fixed.

Figure 5:
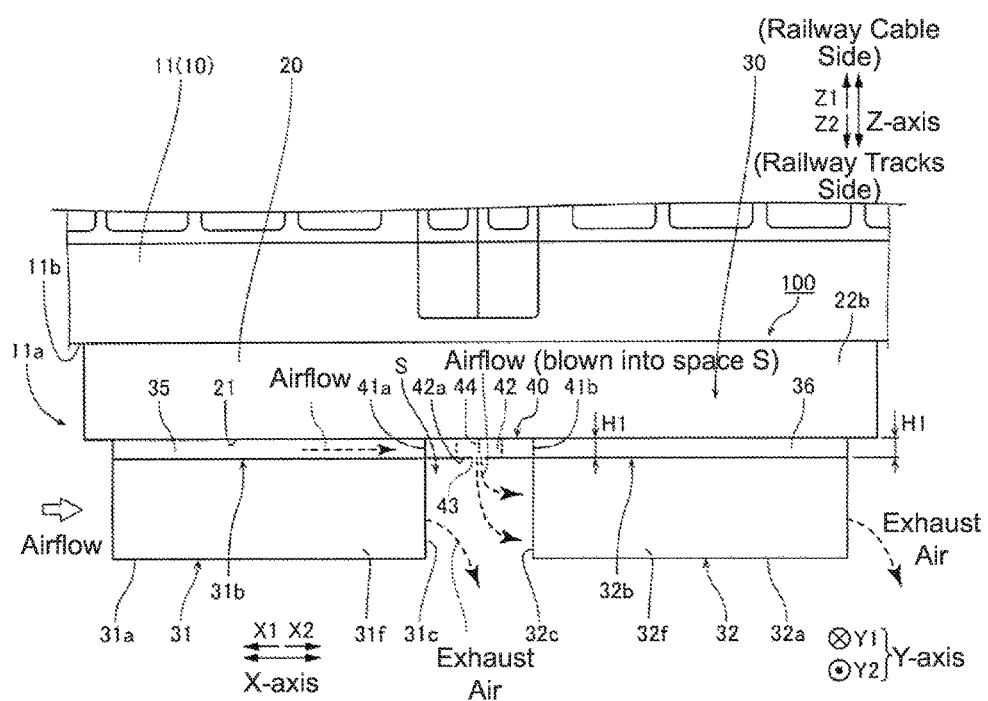
FIG. 5 is a side view illustrating a configuration of the power converter according to Embodiment 1 of the present invention.

The outlet 43 of the air duct 40 is formed in a bottom surface 42a (the Z2 side) of the duct 42 and spans from near the sides 31e and 32e (the Y1 sides) of the radiating fins 31 and 32 to near the other sides 31f and 32f (the Y2 sides) in the railway tie direction. Moreover, the outlet 43 has a slit shape that is formed only at one location in the bottom surface 42a and runs parallel to the Y axis direction in which the duct 42 extends. The outlet 43 creates an opening in the bottom surface 42a of the duct 42 on the side on which the plurality of fins 31a (and 32a) are arranged. Therefore, as illustrated in FIGS. 3 and 5, the outlet 43 exhausts the air in the duct 42 into the space S on the side on which the plurality of fins 31a (and 32a) are formed. In addition, the configuration (shape) of the air duct 40 is symmetric, in the railway tie direction that is orthogonal to the movement direction, about the center line 150 (the dot-dashed line) that runs in the movement direction.

Forming the air duct 40 in this manner in Embodiment 1 ensures that the air (fresh outside air) that enters the inlets 41 in the movement direction when the railway vehicle 10 is moving is guided into the duct 42 and then travels through the duct 42 and the outlet 43 to be exhausted into the space S on the side on which the plurality of fins 31a (and 32a) are arranged.

Figure 4:
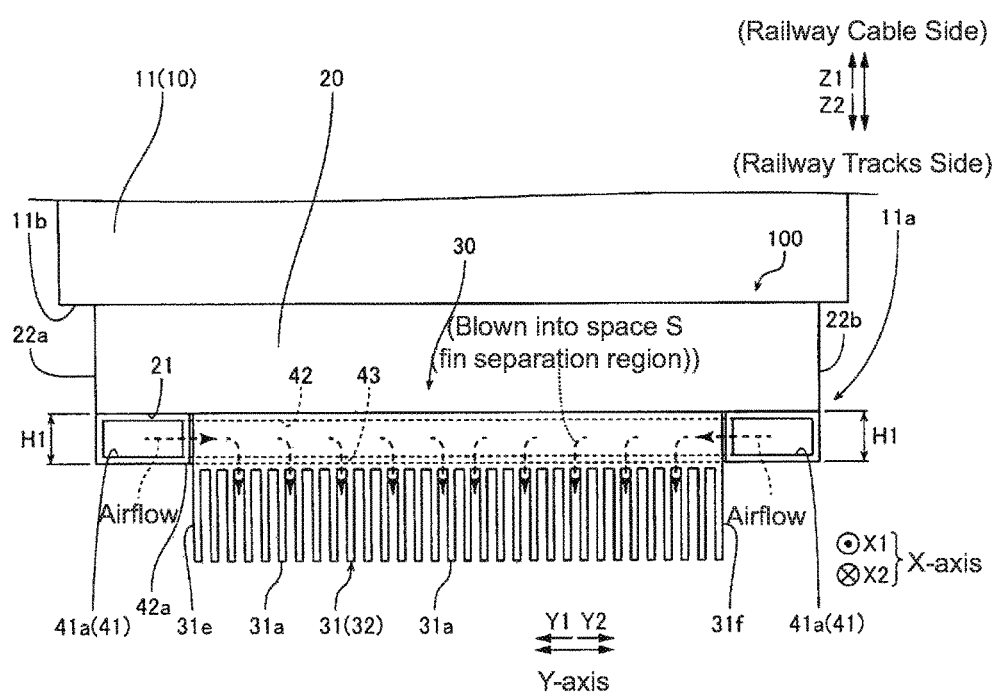
FIG. 4 illustrates the power converter according to Embodiment 1 of the present invention as viewed along a movement direction of the railway vehicle.

As illustrated in FIG. 5, when the railway vehicle 10 (see FIG. 1) is traveling in the X1 direction, for example, the airflow taken in from regions outside the radiating fins 31 and 32 (that is, from the side regions Q1 and Q2 (see FIG. 3) that are near the bottom surface 21 of the semiconductor device 20) flows through the air duct 40 and is guided into the space S. The air that is guided into the space S is then guided to movement direction-side ends 32c of the radiating fins 32. In other words, as illustrated in FIG. 4, the air duct 40 takes in air (the airflow) via the pair of first inlets 41a and then guides that air through the duct 42 that extends to the space S and out of the slit-shaped outlet 43 to be exhausted into the space S. Then, the air (fresh outside air) exhausted into the space S is supplied to the movement direction-side ends 32c of the radiating fins 32.

Meanwhile, although the flow of air for this case is not illustrated in FIG. 5, when the railway vehicle 10 is traveling in the X2 direction, the air (airflow) taken in via the pair of second inlets 41b is guided into the duct 42 and then exhausted through the outlet 43 into the space S. Then, the air (fresh outside air) exhausted into the space S is supplied to movement direction-side ends 31c of the radiating fins 31.

In this way, when the railway vehicle 10 is traveling with the radiating fins 31 on the forward side (the upstream side), the air (airflow) taken in by the air duct 40 from the regions outside the radiating fins 31 and 32 is directly and reliably (and sufficiently) supplied to the movement direction-side ends 32c of the radiating fins 32 in the space S. Moreover, due to this, the air that is heated by the radiating fins 31 is exhausted diagonally downwards (towards the railway 1) from the ends 31c. Therefore, using the air duct 40, air of the same temperature as the airflow (fresh outside air) supplied to the radiating fins 31 can be supplied to the ends 32c and across the entire radiating fins 32, thereby making it possible to maintain the heat dissipation performance of the downstream radiating fins 32 at the same level as the heat dissipation performance of the upstream radiating fins 31.

In addition, as illustrated in FIG. 3, in Embodiment 1 the shape of the air duct 40 is symmetric in the movement direction about a center line 160 (the dot-dashed line) that runs through the space S in the railway tie direction (the Y axis direction) that is orthogonal to the movement direction (the X axis direction). Therefore, although above the flow of air in the air duct 40 was described for a case in which the railway vehicle 10 (see FIG. 1) was traveling in the X1 direction, when the railway vehicle 10 is traveling in the X2 direction, the airflow is taken in through the pair of second inlets 41b in the air duct 40 and then travels through the duct 42 and out of the outlet 43 to be supplied to the movement direction-side ends 31c of the radiating fins 31. In this way, the configuration similarly contributes to preventing a decrease in the heat dissipation performance of the downstream radiating fins 31 in this case as well. The power converter 100 according to Embodiment 1 is thus configured as described above.

(Effects of Embodiment 1)

Embodiment 1 makes it possible to achieve the following effects.

As described above, Embodiment 1 includes the air duct 40 that takes in air from the regions outside the radiating fins 31 and 32 while the railway vehicle 10 is moving and extends into the space S so as to guide the air that is taken in into that space S between the radiating fins 31 and 32. In this way, when the railway vehicle 10 is traveling with the radiating fins 31 on the forward side (the upstream side), the airflow (fresh outside air) taken in from the regions outside the radiating fins 31 and 32 can be brought through the air duct 40 and reliably guided into the space S. Furthermore, the air (airflow) that is guided into the space S can be reliably (and sufficiently) supplied to the rearward (downstream) radiating fins 32, thereby making it possible to maintain the heat dissipation performance of the radiating fins 32 at the same level as the heat dissipation performance of the upstream radiating fins 31. This makes it possible to maximize the heat dissipation performance of the individual radiating fins (of the radiating fins 31 and 32), thereby making it possible to improve the overall heat sink performance (heat dissipation performance) of the heat sink unit 30 of the railway vehicle 10.

Moreover, in Embodiment 1, the air duct 40 includes the duct 42 that extends through the space S and has the same protrusion height as the protrusion height H1 of the bases 35 and 36 of the radiating fins 31 and 32 as well as the outlet 43 that creates an opening in the surface (bottom surface) 42a of the duct 42 on the side on which the plurality of fins 31a (and 32a) are arranged and exhausts the air in the duct 42 into the space S on the side on which the plurality of fins 31a (and 32a) are formed. Because the protrusion height of the duct 42 is equal to the protrusion height H1 of the bases 35 and 36, the duct 42 does not protrude out between the plurality of fins 31a of the radiating fins 31 and the plurality of fins 32a of the radiating fins 32 in the space S, thereby making it possible to easily allocate a passage (space) for the air in the space S. Therefore, the airflow (fresh outside air) exhausted from the outlet 43 is diffused downwards into the space S and can be effectively supplied to the fins 31a of the radiating fins 31 or to the fins 32a of the radiating fins 32, depending on which are currently rearward (downstream) according to the movement direction of the railway vehicle 10.

Moreover, in Embodiment 1, attaching the duct 42 along the surface (bottom surface) 21 of the semiconductor device 20 to which the base 35 is fixed makes it possible to easily arrange the duct 42 that has the same protrusion height as the protrusion height H1 of the base 35 so as to extend along the surface (bottom surface) 21 of the semiconductor device 20 and into the space S.

Furthermore, in Embodiment 1 the duct 42 is configured to extend through the space S in the railway tie direction (the Y axis direction) that is orthogonal to the movement direction. This makes it possible to guide the airflow (fresh outside air) that is taken in from the regions outside the radiating fins 31 and 32 through the duct 42 and into the space S across a wide region (range) that extends from the end sides (the Y1 and Y2 sides) to the center side in the railway tie direction (the Y axis direction).

In addition, in Embodiment 1 the outlet 43 in the duct 42 is formed spanning from near the side 31e (and 32e) of the radiating fins 31 and 32 to near the other side 31f (and 32f) in the railway tie direction (the Y axis direction). This makes it possible to exhaust the airflow (fresh outside air) that is taken in from the regions outside the radiating fins 31 and 32 through the outlet 43 and into the space S across a wide range that spans from near the side 31e (and 32e) to near the other side 31f (and 32f) in the railway tie direction (the Y axis direction). Therefore, the airflow that is diffused into the space S can be uniformly supplied along the railway tie direction (the Y axis direction) to the fins 31a of the radiating fins 31 or to the fins 32a of the radiating fins 32, depending on which are currently rearward (downstream) according to the movement direction of the railway vehicle 10.

Moreover, in Embodiment 1 the outlet 43 is configured to be slit-shaped and to extend along the same direction in which the duct 42 extends. This makes it possible to exhaust the airflow (fresh outside air) that is taken in from the regions outside the radiating fins 31 and 32 through the slit-shaped outlet 43 and into the space S in an air curtain-shaped flow pattern. Therefore, this air curtain-shaped airflow can be uniformly supplied along the railway tie direction (the Y axis direction) from near the side 31e (or 32e) to near the other side 31f (or 32f) of the fins 31a (or 32a), depending on which are currently rearward (downstream) according to the movement direction of the railway vehicle 10.

Furthermore, in Embodiment 1 a single outlet 43 is formed extending along the same direction in which the duct 42 extends. This makes it possible to adjust the length of the single outlet 43 in accordance with the length of the duct 42 that extends through the space S, thereby making it possible to shape the flow pattern of the airflow that is exhausted into the space S from the outlet 43 to have a desired shape.

In addition, in Embodiment 1, the air that enters the air duct 40 in the movement direction via the inlets 41 is guided into the duct 42, and this air travels through the duct 42 and is exhausted through the outlet 43 and into the space S on the side on which the plurality of fins 31a (and 32a) are arranged. This makes it possible to easily take in, via the inlets 41, the airflow flowing along the regions of the railway vehicle 10 on the outer sides (in the side direction) of the fins 31a or 32a (of the radiating fins 31 or 32) in the railway tie direction (the Y axis direction) and also makes it possible to guide that air through the duct-shaped duct 42 that is connected to the inlets 41 and then collect that air in the space S. Then, that air can be reliably supplied to the rearward (downstream) fins 31a or 32a (of the radiating fins 31 or 32) through the outlet 43 that forms an opening into the space S.

Moreover, Embodiment 1 includes the first inlets 41a that take in the airflow when the railway vehicle 10 is traveling with the radiating fins 31 on the forward side in the movement direction as well as the second inlets 41b that take in the airflow when the railway vehicle 10 is traveling with the radiating fins 32 on the forward side in the movement direction. Furthermore, the air-guiding plates 44 are formed in the air duct 40 to guide the air that is taken in through the first inlets 41a or the second inlets 41b (depending on the movement direction) into the duct 42. In this way, the airflow (fresh outside air) that is taken in through the first inlets 41a or the second inlets 41b (depending on the movement direction of the railway vehicle 10) can be reliably supplied from the space S to the rearward (downstream) fins 31a or 32a (of the radiating fins 31 or 32).

In addition, in Embodiment 1, the air duct 40 is formed spanning from the region (side region) Q1 positioned further outwards than the space S on one side (the Y1 side) of the radiating fins 31 and 32 to the region (side region) Q2 positioned further outwards than the space S on the other side (the Y2 side) in the railway tie direction (the Y axis direction) that is orthogonal to the movement direction. This makes it possible to reliably take in the airflow (fresh outside air) from the region (side region) Q1 positioned further outwards than the space S on one side (the Y1 side) in the railway tie direction (the Y axis direction) of the railway vehicle 10 and from the region (side region) Q2 positioned further outwards than the space S on the other side (the Y2 side) and to then reliably guide that air into the space S. Therefore, the overall heat sink performance (heat dissipation performance) of the heat sink unit 30 of the railway vehicle 10 can be maintained at a prescribed level without being significantly affected by the traveling conditions of the railway vehicle 10 or the strength of the resulting airflow.

Moreover, in Embodiment 1, the inlets 41 of the air duct 40 are formed in regions (the side regions Q1 and Q2) positioned on one side (the Y1 side) and on the other side (the Y2 side) of the space S, and these regions are respectively separated outwards from the space S in both directions (that is, in the Y1 direction and in the Y2 direction) in the railway tie direction (the Y axis direction) that is orthogonal to the movement direction. This makes it possible to reliably prevent air that passes through and is heated by the radiating fins 31 or 32 while the railway vehicle 10 is moving from being taken in again via the inlets 41 of the air duct 40.

Furthermore, in Embodiment 1, the air duct 40 is configured to have a shape that is symmetric in the movement direction about the center line 160 that runs through the space S in the railway tie direction (the Y axis direction) that is orthogonal to the movement direction of the railway vehicle 10. This makes it possible to reduce variation between the amounts of heat dissipated by the radiating fins 31 and 32 regardless of whether the railway vehicle 10 is traveling with the radiating fin 31 side or the radiating fin 32 side in the forward direction. In other words, this makes it possible to sufficiently improve the heat sink performance of Embodiment 1 regardless of the movement direction of the railway vehicle 10.

In addition, in Embodiment 1, the air duct 40 is configured to have a shape that is also symmetric, in the railway tie direction (the Y axis direction) that is orthogonal to the movement direction of the railway vehicle 10, about the center line 150 that runs in the movement direction. This makes it possible to uniformly take in the airflow (fresh outside air) from the region (side region) Q1 positioned further outwards than the space S on one side (the Y1 side) in the railway tie direction (the Y axis direction) of the railway vehicle 10 and from the region (side region) Q2 positioned further outwards than the space S on the other side (the Y2 side) and to then guide that air into the space S. Therefore, the overall heat sink performance (heat dissipation performance) of the heat sink unit 30 of the railway vehicle 10 can be maintained at a prescribed level without being significantly affected by the traveling conditions of the railway vehicle 10 or the strength of the resulting airflow.

Moreover, in Embodiment 1 the duct 42 extends through the space S in the railway tie direction (the Y axis direction) that is orthogonal to the movement direction. Therefore, when the plurality of fins 31a and 32a of the radiating fins 31 and 32 are formed extending in the vertical direction (the Z axis direction) of the railway vehicle 10, the airflow (fresh outside air) exhausted from the outlet 43 can be diffused into the space S and can then be effectively supplied to the fins 31a or 32a (of the radiating fins 31 or 32), depending on which are currently rearward (downstream) according to the movement direction of the railway vehicle 10.

Furthermore, in Embodiment 1, the radiating fins 31 and 32 are mounted in the underfloor space 11a of the railway vehicle 10, and the air duct 40 is attached along the bottom surface 21 of the semiconductor device 20 to which the radiating fins 31 and 32 are fixed. In addition, the air duct 40 is configured to guide air (airflow) taken in from positions near the bottom surface 21 of the semiconductor device 20 while the railway vehicle 10 is moving into the space S between the radiating fins 31 and 32 and then exhaust that air to the movement direction-side ends 32c (or 31c) of the radiating fins 31 or 32. Therefore, when there is sufficient space to mount the radiating fins 31 and 32 beneath the semiconductor device 20 (on the Z2 side), the radiating fins 31 and 32 can easily be mounted in a way that makes it possible to effectively equalize the heat sink performance (heat dissipation performance) of the radiating fins 31 and 32 when dissipating heat from the semiconductor device 20.

Embodiment 2

Next, Embodiment 2 will be described with reference to FIGS. 1, 6, and 7. Embodiment 2 will be described using an example in which the shape and arrangement of inlets 241 of an air duct 240 are different from Embodiment 1. Note that in the figures, the same reference characters are used for components that are the same as in Embodiment 1.

Figure 6:
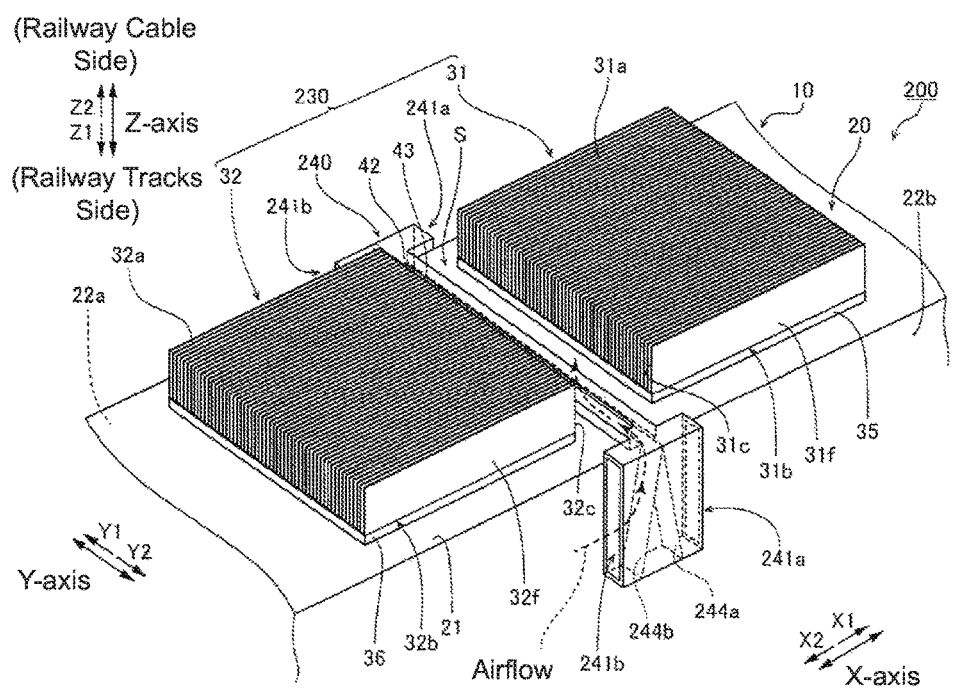
FIG. 6 is a perspective view of a power converter according to Embodiment 2 of the present invention as viewed from below.

As illustrated in FIG. 6, a power converter 200 (see FIG. 1) according to Embodiment 2 of the present invention includes a heat sink unit 230. Moreover, the air duct 240 is mounted between radiating fins 31 and 32 of the heat sink unit 230. Note that here, the power converter 200 is one example of a "power converter for a railway vehicle" as described in the claims.

Figure 7:
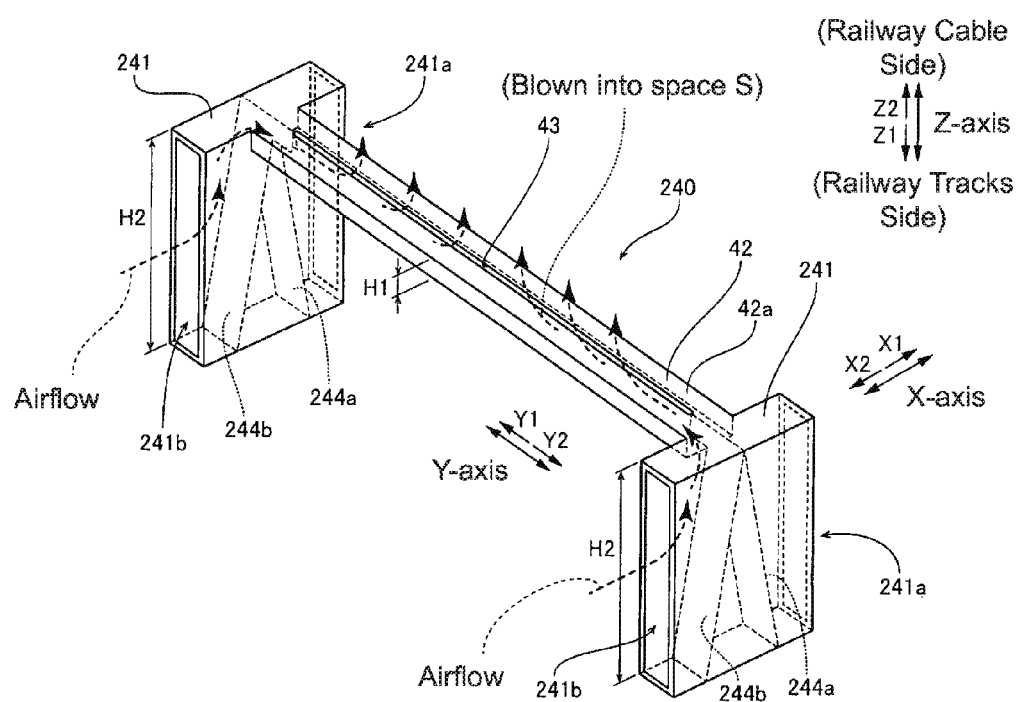
FIG. 7 is a perspective view illustrating a configuration of an air duct in Embodiment 2 of the present invention.

As illustrated in FIG. 7, in Embodiment 2 the air duct 240 includes the inlets 241, a duct 42, and an outlet 43. Moreover, the inlets 241 are arranged on a side face 22a (on the Y1 side) and on a side face 22b (on the Y2 side) of a semiconductor device 20 at positions further outwards than a space S. In other words, the inlets 241 are arranged on the faces on both sides of the semiconductor device 20 (that is, on the side faces 22a and 22b) at positions further outwards than the space S. Furthermore, the height H2 (length in the Z axis direction) of the inlets 241 is greater than the height H1 (length in the Z axis direction) of the duct 42. In addition, air-guiding plates 244a and 244b (illustrated by the dashed lines) are formed inside of the inlets 241 to guide air (airflow) that is taken in through first inlets 241a or second inlets 241b (depending on the movement direction) into the duct 42. In this way, as illustrated in FIG. 6, the air (airflow) that flows along the side faces 22a and 22b at positions higher (that is, on the Z1 side) than a bottom surface 21 of the semiconductor device 20 while a railway vehicle 10 is moving is taken in through the inlets 241, and then the air that is taken in through the inlets 241 is guided into the duct 42. Note that here, the side faces 22a and 22b are an example of "surfaces on both sides of the power converter body" as described in the claims. Similarly, the air-guiding plates 244a and 244b are an example of "air-guiding plates" as described in the claims.

When the railway vehicle 10 (see FIG. 1) is traveling in the X1 direction, for example, the airflow taken in from along the side faces 22a and 22b of the semiconductor device 20 via a pair of first inlets 241a flows through the air duct 240 and is guided into the space S. Then, the air that is guided into the space S is guided to movement direction-side ends 32c of the radiating fins 32. Moreover, when the railway vehicle 10 is traveling in the X2 direction, the air (fresh outside air) taken in through a pair of second inlets 241b travels through the duct 42 and is exhausted from the outlet 43 into the space S to be supplied to movement direction-side ends 31c of the radiating fins 31. The rest of the configuration of the power converter 200 according to Embodiment 2 is the same as in Embodiment 1.

(Effects of Embodiment 2)

As described above, in Embodiment 2 the air duct 240 is attached to the bottom surface 21 of the semiconductor device 20. Moreover, the inlets 241 are arranged on the side faces 22a and 22b the semiconductor device 20 at positions further outwards than the space S. In other words, the inlets 241 are arranged at positions further outwards than the space S so as to sandwich the faces on both sides of the semiconductor device 20 (that is, the side faces 22a and 22b). Furthermore, the air duct 240 is configured to take in, through the inlets 241, the air that flows along the faces on both sides of the semiconductor device 20 (the side faces 22a and 22b) while the railway vehicle 10 is moving and to then guide the air taken in through the inlets 241 into the duct 42. This makes it possible to effectively take in the airflow (fresh outside air) that flows along the faces on both sides of the semiconductor device 20 (the side faces 22a and 22b) and then effectively supply that air to fins 31a or 32a (of the radiating fins 31 or 32), depending on which are currently rearward (downstream) according to the movement direction of the railway vehicle 10.

Moreover, in Embodiment 2, the length (height) H2 of the inlets 241 is greater than the length (height) H1 of the duct 42 in the direction (the Z axis direction) that is orthogonal to the movement direction. This makes it possible to increase the opening area of the inlets 241, thereby making it possible to temporarily collect more of the airflow (fresh outside air) that was taken in within the duct 42 and then vigorously exhaust the air collected in the duct 42 into the space S. The rest of the effects of Embodiment 2 are the same as in Embodiment 1.

Embodiment 3

Next, Embodiment 3 will be described with reference to FIGS. 1, 8, and 9. Embodiment 3 will be described using an example in which an air-guiding member 50 is attached to the air duct 40 of Embodiment 1. Note that in the figures, the same reference characters are used for components that are the same as in Embodiment 1.

Figure 9:
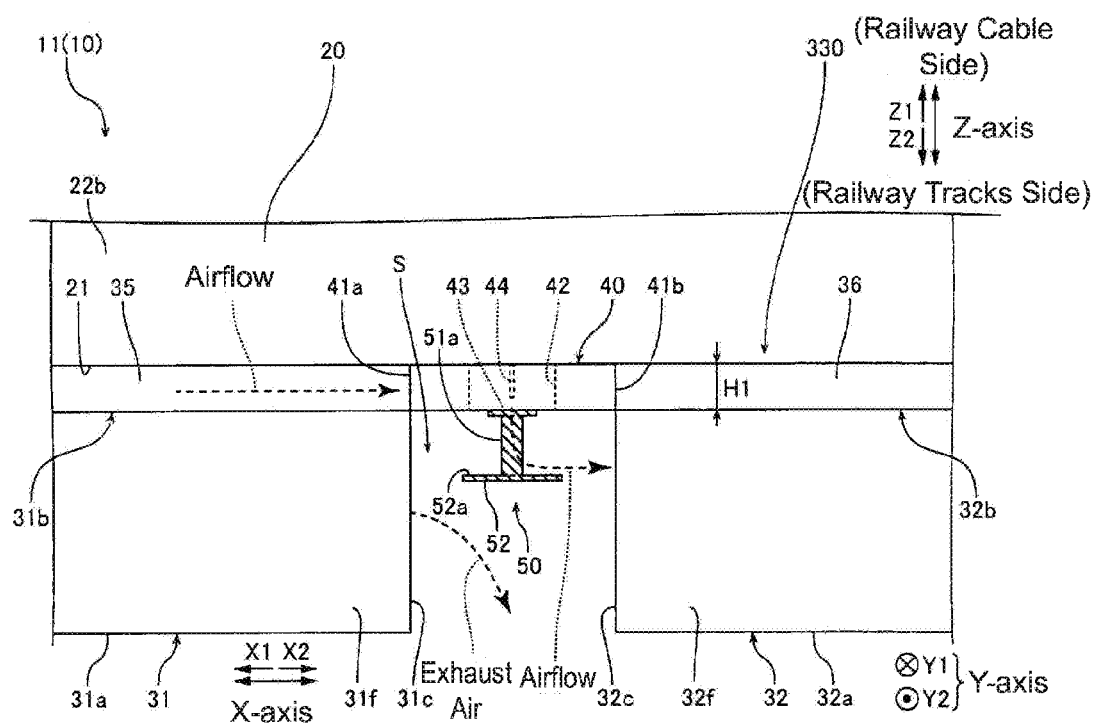
FIG. 9 is a side view illustrating a heat sink structure of a power converter according to Embodiment 3 of the present invention.

As illustrated in FIG. 9, a power converter 300 (see FIG. 1) according to Embodiment 3 of the present invention includes a heat sink unit 330 in which the additional air-guiding member 50 is attached to the air duct 40.

Figure 8:
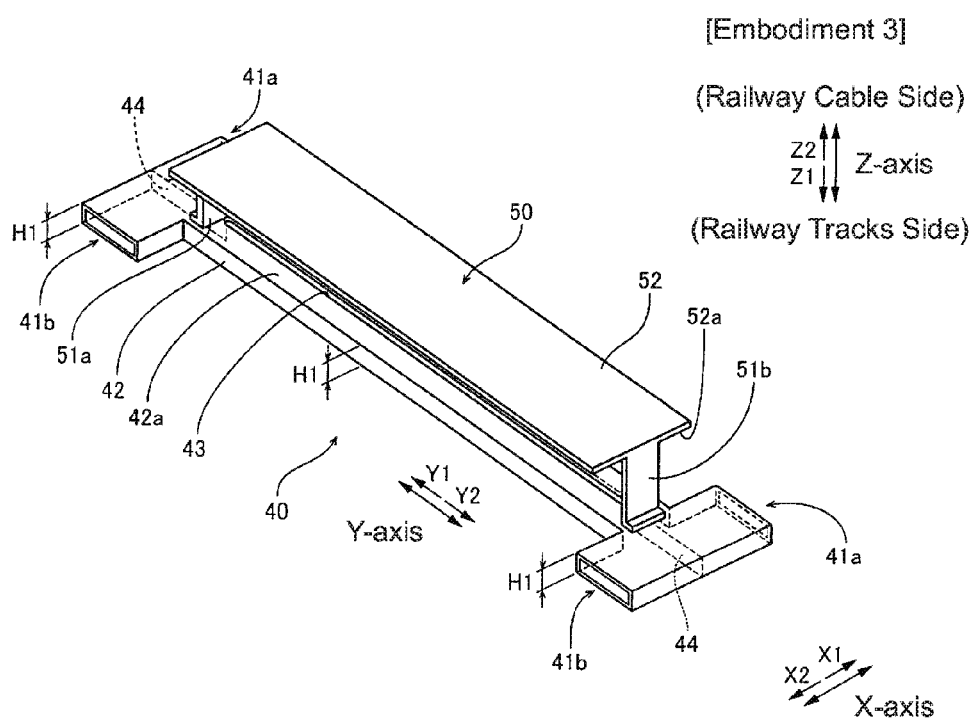
FIG. 8 is a perspective view illustrating a configuration of an air duct in Embodiment 3 of the present invention.

More specifically, as illustrated in FIG. 8, the air-guiding member 50 includes a leg 51a (on the Y1 side) and a leg 51b (on the Y2 side) that are welded to a bottom surface 42a of a duct 42 at positions slightly outwards from both length-wise ends of an outlet 43. The air-guiding member 50 also includes an integrated flat plate-shaped air guide 52 that connects together the pair of legs 51a and 51b in the Y axis direction (the railway tie direction). The air guide 52 is arranged separated from the bottom surface 42a of the duct 42 by a prescribed distance in the Z2 direction. Moreover, the air-guiding member 50 is attached to the duct 42 with the center position of the air-guiding member 50 in the X axis direction being aligned with the outlet 43. Note that here, the power converter 300 is one example of a "power converter for a railway vehicle" as described in the claims. Similarly, the air-guiding member 50 is an example of an "air-guiding plate" as described in the claims.

The air-guiding member 50 guides air that is exhausted through the outlet 43 into a space S on a side on which fins 31a (and 32a) are formed towards movement direction-side ends 32c (or 31c) of radiating fins 31 or 32. In this way, both the air duct 40 and the air-guiding member 50 can be used to efficiently and reliably guide the airflow (fresh outside air) to the movement direction-side ends 31c (or 32c) of the fins 31a (or 32a), depending on which are currently rearward (downstream) according to the movement direction of a railway vehicle 10.

As illustrated in FIG. 9, when the railway vehicle 10 is traveling with the radiating fins 31 on the forward side (upstream side), for example, the air exhausted downwards (in the Z2 direction) from the outlet 43 hits a rear surface 52a of the air guide 52 and is redirected into the X2 direction. Then, the air (fresh outside air) that was redirected into the X2 direction is reliably supplied to the movement direction-side ends 32c of the radiating fins 32. Furthermore, although the flow of air for this case is not illustrated in FIG. 9, when the railway vehicle 10 is traveling in the X2 direction, the air exhausted downwards (in the Z2 direction) from the outlet 43 hits the rear surface 52a of the air guide 52 and is redirected into the X1 direction, and then this redirected air is reliably supplied to the movement direction-side ends 31c of the radiating fins 31. The rest of the configuration of the power converter 300 according to Embodiment 3 is the same as in Embodiment 1.

(Effects of Embodiment 3)

As described above, in Embodiment 3 the heat sink unit 330 includes the air-guiding member 50, which guides air that is exhausted through the outlet 43 into the space S on the side on which the fins 31a (and 32a) are formed towards the movement direction-side ends 31c (or 32c) of the radiating fins 31 or 32. This makes it possible to use the air-guiding member 50 to efficiently and reliably guide the airflow (fresh outside air) to the movement direction-side ends 31c (or 32c) of the fins 31a (or 32a), depending on which are currently rearward (downstream) according to the movement direction of a railway vehicle 10. The rest of the effects of Embodiment 3 are the same as in Embodiment 1.

Embodiment 4

Next, Embodiment 4 will be described with reference to FIGS. 10 to 12. Embodiment 4 will be described using an example in which radiating fins 431 and 432 and an air duct 440 that are configured similar to the radiating fins 31 and 32 and the air duct 40 of Embodiment 1 are arranged along a side of a semiconductor device 420. Note that in the figures, the same reference characters are used for components that are the same as in Embodiment 1.

Figure 10:
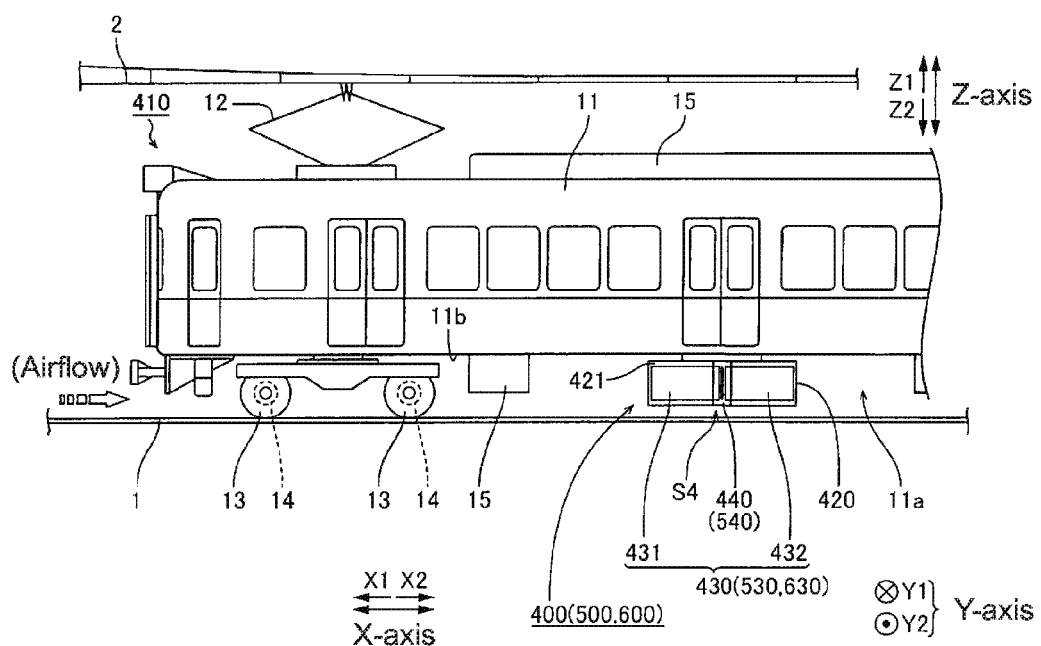
FIG. 10 is a side view illustrating a railway vehicle in Embodiment 4 of the present invention.
Figure 11:
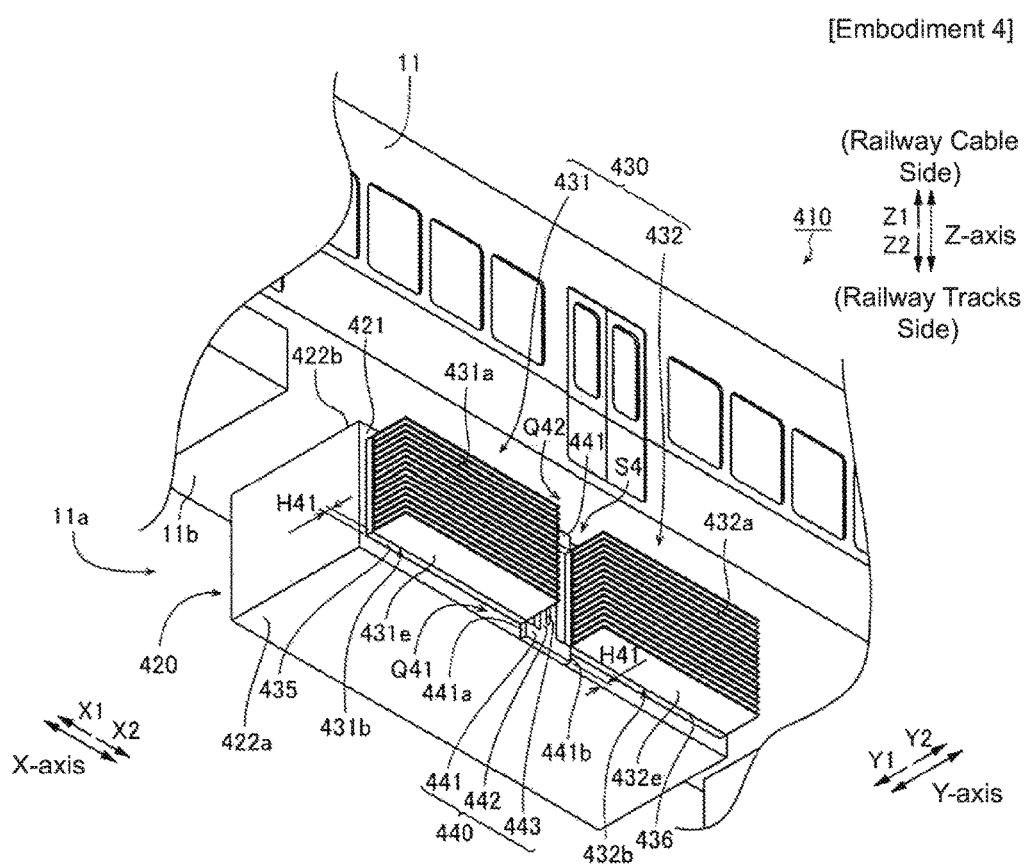
FIG. 11 is a perspective view of the railway vehicle in Embodiment 4 of the present invention as viewed from diagonally below.

As illustrated in FIGS. 10 and 11, a power converter 400 according to Embodiment 4 of the present invention includes the semiconductor device 420 and a heat sink unit 430. Moreover, the heat sink unit 430 is arranged on a side face (the face on the Y2 side) of the semiconductor device 420, which is fixed to a bottom surface 11b of a vehicle body 11. Furthermore, the heat sink unit 430 includes radiating fins 431 (on the X1 side) and radiating fins 432 (on the X2 side) that are arranged separated from one another by a prescribed distance in the X axis direction in which the vehicle body 11 extends. The radiating fins 431 and 432 have thin plate shapes that extend outwards (in the Y2 direction) from the side face on the Y2 side of the semiconductor device 420 and run parallel to the X axis direction. Note that here, the semiconductor device 420 is one example of a "power converter body" as described in the claims. Moreover, the radiating fins 431 and 432 are examples of "first radiating fin unit" and "second radiating fin unit" as recited in the claims, respectively.

The radiating fins 431 include a plurality of thin plate-shaped fins 431a and a base 435 to which roots are connected. The radiating fins 432 include a plurality of thin plate-shaped fins 432a and a base 436 to which roots are connected. The radiating fins 431 and 432 are attached to a side face 421 of the semiconductor device 420 via the bases 435 and 436, respectively. The bases 435 and 436 have a prescribed protrusion height H41 (thickness in the Y axis direction). Furthermore, the radiating fins 431 and 432 are arranged separated from one another by a space S4 of a prescribed width in the X axis direction. Note that here, the side face 421 is one example of a "surface of the power converter body" as recited in the claims. Similarly, the space S4 is one example of a "fin separation space" as recited in the claims. Moreover, the side face 421 is one example of a "surface of the power converter body" as recited in the claims.

As illustrated in FIG. 10, when a railway vehicle 410 travels in the X1 direction, air near a railway 1 flows in the X2 direction relative to the railway vehicle 410 and blows onto the heat sink unit 430 in an underfloor space 11a. This airflow flows in the X2 direction through gaps between the fins 431a and 432a that extend in the X axis direction (see FIG. 11). In this way, heat from the heat sink unit 430 is exhausted to the outside air. The remainder of this description assumes that the railway vehicle 410 travels in the X1 direction, that the radiating fins 431 are arranged on the upstream side (the X1 side) in the movement direction (the direction of travel), and that the radiating fins 432 are arranged on the downstream side (the X2 side) at a further rearward position.

Figure 12:
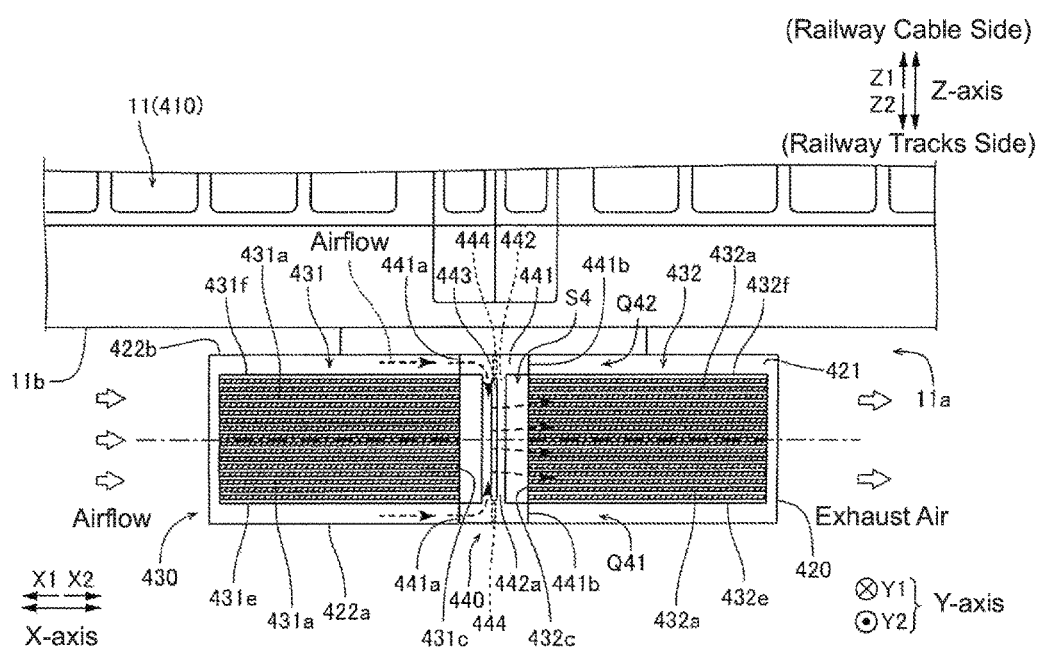
FIG. 12 is a side view illustrating a heat sink structure of a power converter according to Embodiment 4 of the present invention.

As illustrated in FIGS. 11 and 12, in Embodiment 4 the air duct 440 is arranged in the space S4 between the radiating fins 431 and the radiating fins 432. The air duct 440 is attached along the side face 421 of the semiconductor device 420 to which the base 435 is fixed. Moreover, the air duct 440 includes a pair of inlets 441, a duct 442, and an outlet 443.

As illustrated in FIG. 12, each of the inlets 441 of the air duct 440 includes a first inlet 441a that takes in the airflow when the railway vehicle 410 is traveling with the radiating fins 431 on the forward side in the movement direction as well as a second inlet 441b that takes in the airflow when the railway vehicle 410 is traveling with the radiating fins 432 on the forward side in the movement direction. Moreover, air-guiding plates 444 (illustrated by the dashed lines in FIG. 12) are formed inside of the air duct 440 to guide the air that is taken in through the first inlets 441a or the second inlets 441b (depending on the movement direction) into the duct 442. Furthermore, the inlets 441 (the first inlets 441a and the second inlets 441b) are respectively formed in regions Q41 and Q42 that are separated outwards from the space S4 on both sides (that is, in the Z1 and Z2 directions) in the vertical direction of the railway vehicle 410 (the Z axis direction) that is orthogonal to the movement direction (the X axis direction). Note that here, the air-guiding plates 444 are an example of "air-guiding plates" as recited in the claims.

The air duct 440 is formed spanning from the region Q41 on one side (the Z2 side) of the radiating fins 431 and 432 to the region Q42 on the other side (the Z1 side) in the Z axis direction. Moreover, the flow paths from the first inlets 441a and the second inlets 441b that are separated from one another by the air-guiding plates 444 are joined together inside the duct 442 to form a single passage. Furthermore, the duct 442 extends through the space S4 with a height (height H41) in the Y axis direction that is substantially equal to the length H41 of the base 435 in the Y axis direction (see FIG. 11). The duct 442 has a rectangular cross-sectional shape. In addition, the air duct 440 that includes the inlets 441 and the duct 442 is attached along the side face 421 of the semiconductor device 420 to which the base 435 is fixed.

The outlet 443 of the air duct 440 is formed in a side face 442a (the Y2 side) of the duct 442 and spans from near the sides 431e and 432e (the Z2 sides) of the radiating fins 431 and 432 to near the other sides 431f and 432f (the Z1 sides) in the Z axis direction. Moreover, the outlet 443 has a slit shape that is formed only at one location in the side face 442a and runs parallel to the Z axis direction in which the duct 442 extends. The outlet 443 creates an opening in the side face 442a of the duct 442 on the side on which the plurality of fins 431a (and 432a) are arranged.

Forming the air duct 440 in this manner in Embodiment 4 ensures that the air (fresh outside air) that enters the inlets 441 in the movement direction when the railway vehicle 410 is moving is guided into the duct 442 and then travels through the duct 442 and the outlet 443 to be exhausted into the space S4 on the side on which the plurality of fins 431a (and 432a) are arranged.

As illustrated in FIG. 12, when the railway vehicle 410 (see FIG. 10) is traveling in the X1 direction, for example, the airflow taken in from regions outside the radiating fins 431 and 432 (that is, from the regions Q41 and Q42 that are near the side face 421 of the semiconductor device 420) flows through the air duct 440 and is guided into the space S4. The air that is guided into the space S4 is then guided to movement direction-side ends 432c of the radiating fins 432. In other words, the air duct 440 takes in air (the airflow) via the pair of first inlets 441a and then guides that air through the duct 442 that extends to the space S4 and out of the slit-shaped outlet 443 to be exhausted into the space S4. Then, the air (fresh outside air) exhausted into the space S4 is supplied to the movement direction-side ends 432c of the radiating fins 432.

Meanwhile, although the flow of air for this case is not illustrated in FIG. 12, when the railway vehicle 410 is traveling in the X2 direction, the air (airflow) taken in via the pair of second inlets 441b is guided into the duct 442 and then exhausted through the outlet 443 into the space S4.

Then, the air (fresh outside air) exhausted into the space S4 is supplied to movement direction-side ends 431c of the radiating fins 431.

In this way, when the railway vehicle 410 is traveling with the radiating fins 431 on the forward side (the upstream side), the air (airflow) taken in by the air duct 440 from the regions outside the radiating fins 431 and 432 is directly and reliably (and sufficiently) supplied to the movement direction-side ends 432c of the radiating fins 432 in the space S4. Moreover, due to this, the air that is heated by the radiating fins 431 is exhausted diagonally outwards (towards the Y2 side) from the ends 431c. Therefore, using the air duct 440, air of the same temperature as the airflow (fresh outside air) supplied to the radiating fins 431 can be supplied to the ends 432c and across the entire radiating fins 432, thereby making it possible to maintain the heat dissipation performance of the downstream radiating fins 432 at the same level as the heat dissipation performance of the upstream radiating fins 431.

In the power converter 400 according to Embodiment 4, the configuration of the power converter 100 of Embodiment 1, in which the heat sink unit 30 is arranged beneath the semiconductor device 20, is replaced by a configuration in which the heat sink unit 430 is arranged on the side of the semiconductor device 420. Therefore, the rest of the configuration of the power converter 400 according to Embodiment 4 is the same as the configuration of the power converter 100 according to Embodiment 1 except in that the Y axis direction and the Z axis direction are respectively switched with the Z axis direction and the Y axis direction.

(Effects of Embodiment 4)

Embodiment 4 makes it possible to achieve the following effects.

As described above, Embodiment 4 includes the air duct 440 that takes in air from the regions outside the radiating fins 431 and 432 while the railway vehicle 410 is moving and extends into the space S4 so as to guide the air that is taken in into that space S4 between the radiating fins 431 and 432. In this way, when the railway vehicle 410 is traveling with the radiating fins 431 on the forward side (the upstream side), the airflow (fresh outside air) taken in from the regions outside the radiating fins 431 and 432 can be brought through the air duct 440 and reliably guided into the space S4. Furthermore, the air (airflow) that is guided into the space S4 can be reliably (and sufficiently) supplied to the rearward (downstream) radiating fins 432, thereby making it possible to maintain the heat dissipation performance of the radiating fins 432 at the same level as the heat dissipation performance of the upstream radiating fins 431. This makes it possible to maximize the heat dissipation performance of the individual radiating fins (of the radiating fins 431 and 432), thereby making it possible to improve the overall heat sink performance (heat dissipation performance) of the heat sink unit 430 of the railway vehicle 410.

Moreover, in Embodiment 4, the air duct 440 includes the duct 442 that extends through the space S4 and has the same protrusion height as the protrusion height H41 of the bases 435 and 436 of the radiating fins 431 and 432 as well as the outlet 443 that creates an opening in the surface (side face) 442a of the duct 442 on the side on which the plurality of fins 431a (and 432a) are arranged and exhausts the air in the duct 442 into the space S4 on the side on which the plurality of fins 431a (and 432a) are formed. Because the protrusion height of the duct 442 is equal to the protrusion height H41 of the base 435, the duct 442 does not protrude out between the plurality of fins 431a of the radiating fins 431 and the plurality of fins 432a of the radiating fins 432 in the space S4, thereby making it possible to easily allocate a passage (space) for the air in the space S4. Therefore, the airflow (fresh outside air) exhausted from the outlet 443 is diffused outwards into the space S4 and can be effectively supplied to the fins 431a of the radiating fins 431 or to the fins 432a of the radiating fins 432, depending on which are currently rearward (downstream) according to the movement direction of the railway vehicle 410.

Moreover, in Embodiment 4 the duct 442 extends through the space S4 in the vertical direction of the railway vehicle 410 (the Z axis direction) that is orthogonal to the movement direction. Therefore, when the plurality of fins 431a and 432a of the radiating fins 431 and 432 are formed extending in the railway tie direction (in the Y axis direction) of the railway vehicle 410, the airflow (fresh outside air) exhausted from the outlet 443 can be diffused into the space S4 and can then be effectively supplied to the fins 431a or 432a (of the radiating fins 431 or 432), depending on which are currently rearward (downstream) according to the movement direction of the railway vehicle 410.

Furthermore, in Embodiment 4, the radiating fins 431 and 432 are mounted in the underfloor space 11a of the railway vehicle 410, and the air duct 440 is attached along the side face 421 of the semiconductor device 420 to which the radiating fins 431 and 432 are fixed. In addition, the air duct 440 is configured to guide air (airflow) taken in from positions near the side face 421 of the semiconductor device 420 while the railway vehicle 410 is moving into the space S4 between the radiating fins 431 and 432 and then exhaust that air to the movement direction-side ends 432c (or 431c) of the radiating fins 431 or 432. Therefore, when there is sufficient space to mount the radiating fins 431 and 432 on the side of the semiconductor device 420 (on the Y1 side or on the Y2 side), the radiating fins 431 and 432 can easily be mounted in a way that makes it possible to effectively equalize the heat sink performance (heat dissipation performance) of the radiating fins 431 and 432 when dissipating heat from the semiconductor device 420. Moreover, in Embodiment 4, the radiating fins 431 and 432 are mounted on the side (the Y2 side) of the semiconductor device 420, and therefore the radiating fins 431 and 432 are exposed on the side (the Y2 side) of the railway vehicle 410 while the railway vehicle 410 is moving. This makes it possible to take in an airflow that is less turbulent than when taking in fresh outside air from beneath the railway vehicle 410 (where other devices or the like may be attached), thereby making it possible for the radiating fins 431 and 432 to easily take in fresh outside air from the side (the Y2 side) of the railway vehicle 410. This, in turn, makes it possible to further improve the heat sink performance (heat dissipation performance) of the heat sink unit 430. The rest of the effects of Embodiment 4 are the same as in Embodiment 1.

Embodiment 5

Next, Embodiment 5 will be described with reference to FIGS. 10, 13, and 14.

Embodiment 5 will be described using an example in which the shape and arrangement of inlets 541 of an air duct 540 are different from Embodiment 4. Note that in the figures, the same reference characters are used for components that are the same as in Embodiment 4.

Figure 13:
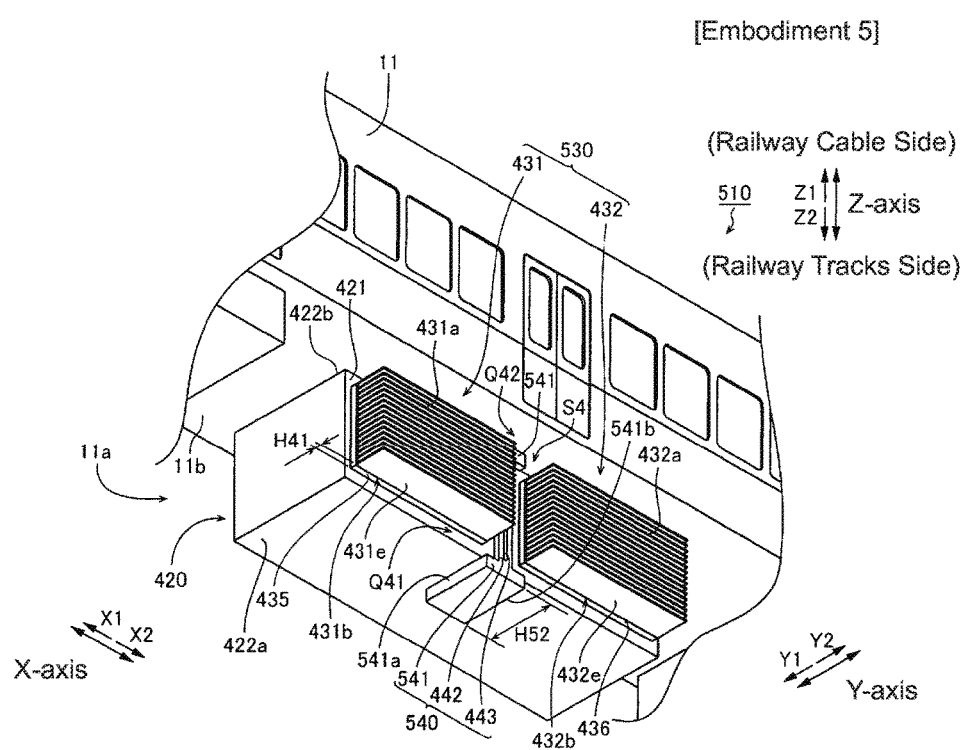
FIG. 13 is a perspective view of a railway vehicle in Embodiment 5 of the present invention as viewed from diagonally below.
Figure 14:
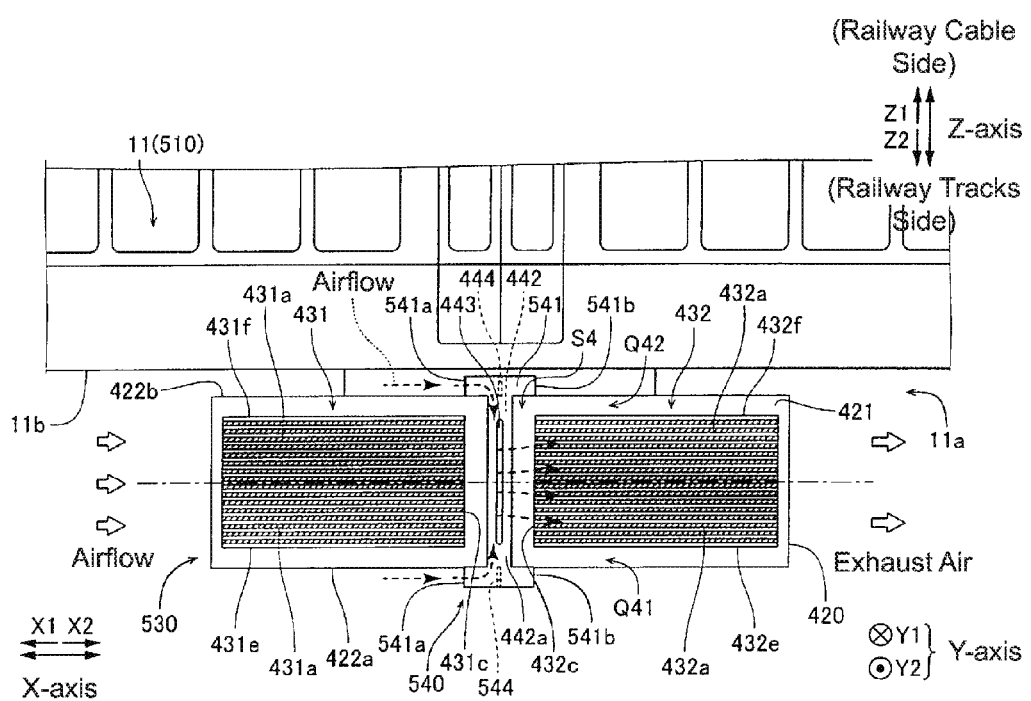
FIG. 14 is a side view illustrating a heat sink structure of a power converter according to Embodiment 5 of the present invention.

As illustrated in FIG. 13, a power converter 500 (see FIG. 10) according to Embodiment 5 of the present invention includes a heat sink unit 530. Moreover, the air duct 540 is mounted between radiating fins 431 and 432 of the heat sink unit 530. Note that here, the power converter 500 is one example of a "power converter for a railway vehicle" as described in the claims.

As illustrated in FIG. 13, in Embodiment 5 the air duct 540 includes the inlets 541, a duct 442, and an outlet 443. Moreover, the inlets 541 are arranged on a bottom surface 422a (on the Z2 side) and on a top surface 422b (on the Z1 side) of a semiconductor device 420 at positions further outwards than a space S4. In other words, the inlets 541 are arranged at positions further outwards than the space S4 so as to sandwich the surfaces on both sides of the semiconductor device 420 (that is, the bottom surface 422a and the top surface 422b). Furthermore, the length H52 of the inlets 541 in the Y axis direction is greater than the length H41 of the duct 442. Therefore, as illustrated in FIG. 14, the air (airflow) that flows along the bottom surface 422a and the top surface 422b at positions further outwards (on the Y2 side) than a side face 421 of the semiconductor device 420 while a railway vehicle 410 is moving is taken in through the inlets 541, and then the air that is taken in through the inlets 541 is guided into the duct 442. Note that here, the bottom surface 422a and the top surface 422b are an example of "surfaces on both sides of the power converter body."

In this way, when the railway vehicle 410 (see FIG. 11) is traveling in the X1 direction, the airflow taken in from along the bottom surface 422a and the top surface 422b of the semiconductor device 420 via a pair of first inlets 541a flows through the air duct 540 and is guided into the space S4. Then, the air that is guided into the space S4 is guided to movement direction-side ends 432c of the radiating fins 432. Moreover, when the railway vehicle 410 is traveling in the X2 direction, the air (fresh outside air) taken in through a pair of second inlets 541b travels through the duct 442 and is exhausted from the outlet 443 into the space S4 to be supplied to movement direction-side ends 431c of the radiating fins 431.

In the power converter 500 according to Embodiment 5, the configuration of the power converter 200 of Embodiment 2, in which the heat sink unit 230 is arranged beneath the semiconductor device 20, is replaced by a configuration in which the heat sink unit 530 is arranged on the side of the semiconductor device 420. Therefore, the rest of the configuration of the power converter 500 according to Embodiment 5 is the same as the configuration of the power converter 200 according to Embodiment 2 except in that the Y axis direction and the Z axis direction are respectively switched with the Z axis direction and the Y axis direction.

(Effects of Embodiment 5)

As described above, in Embodiment 5 the air duct 540 is attached to the side face 421 of the semiconductor device 420. Moreover, the inlets 541 are arranged on the bottom surface 422a and the top surface 422b of the semiconductor device 420 at positions further outwards than the space S4. In other words, the inlets 541 are arranged at positions further outwards than the space S4 so as to sandwich the surfaces on both sides of the semiconductor device 420 (that is, the bottom surface 422a and the top surface 422b). Furthermore, the air duct 540 is configured to take in, through the inlets 541, the air that flows along the surfaces on both sides of the semiconductor device 420 (the bottom surface 422a and the top surface 422b) while the railway vehicle 410 is moving and to then guide the air taken in through the inlets 541 into the duct 442. This makes it possible to effectively take in the airflow (fresh outside air) that flows along the surfaces on both sides of the semiconductor device 420 (the bottom surface 422a and the top surface 422b) and then effectively supply that air to fins 431a or 432a (of the radiating fins 431 or 432), depending on which are currently rearward (downstream) according to the movement direction of the railway vehicle 410.

Moreover, in Embodiment 5, the length H52 of the inlets 541 is greater than the length H41 of the duct 442 in the direction (the Y axis direction) that is orthogonal to the movement direction. This makes it possible to increase the opening area of the inlets 541, thereby making it possible to temporarily collect more of the airflow (fresh outside air) that was taken in within the duct 442 and then vigorously exhaust the air collected in the duct 442 into the space S4. Moreover, in Embodiment 5, the radiating fins 431 and 432 are mounted on the side (the Y2 side) of the semiconductor device 420, and therefore the radiating fins 431 and 432 are exposed on the side (the Y2 side) of the railway vehicle 410 while the railway vehicle 410 is moving. This makes it possible to take in an airflow that is less turbulent than when taking in fresh outside air from beneath the railway vehicle 410 (where other devices or the like may be attached), thereby making it possible for the radiating fins 431 and 432 to easily take in fresh outside air from the side (the Y2 side) of the railway vehicle 410. This, in turn, makes it possible to further improve the heat sink performance (heat dissipation performance) of the heat sink unit 530. The rest of the effects of Embodiment 5 are the same as in Embodiment 2.

Embodiment 6

Next, Embodiment 6 will be described with reference to FIGS. 10 and 15. Embodiment 6 will be described using an example in which an air-guiding member 650 is attached to the air duct 440 of Embodiment 4. Note that in the figures, the same reference characters are used for components that are the same as in Embodiment 4.

Figure 15:
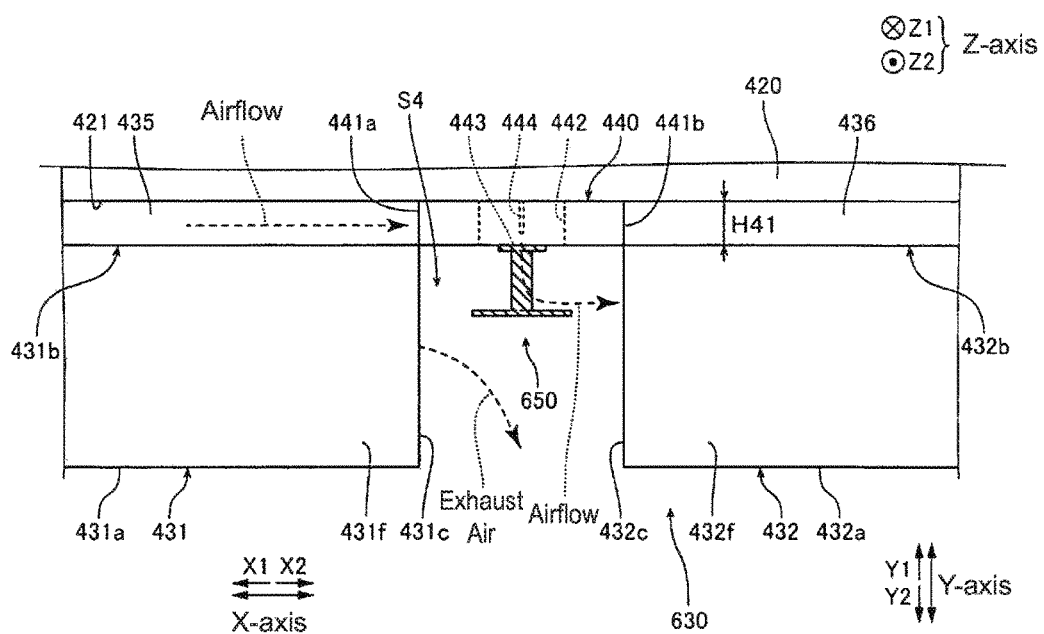
FIG. 15 is a bottom view illustrating the primary components of a heat sink structure of a power converter according to Embodiment 6 of the present invention.

As illustrated in FIG. 15, a power converter 600 (see FIG. 10) according to Embodiment 6 of the present invention includes a heat sink unit 630 in which the additional air-guiding member 650 is attached to the air duct 440. Note that here, the air-guiding member 650 is an example of an "air-guiding plate" as recited in the claims.

The air-guiding member 650 guides air that is exhausted through an outlet 443 into a space S4 on a side on which fins 431a (and 432a) are formed towards movement direction-side ends 432c (or 431c) of radiating fins 431 or 432. In this way, both the air duct 440 and the air-guiding member 650 can be used to efficiently and reliably guide the airflow (fresh outside air) to the movement direction-side ends 431c (or 432c) of the fins 431a (or 432a), depending on which are currently rearward (downstream) according to the movement direction of a railway vehicle 410.

As illustrated in FIG. 15, when the railway vehicle 410 is traveling with the radiating fins 431 on the forward side (upstream side), for example, the air exhausted outwards (in the Y2 direction) from the outlet 443 is redirected into the X2 direction. Then, the air (fresh outside air) that was redirected into the X2 direction is reliably supplied to the movement direction-side ends 432c of the radiating fins 432. Furthermore, although the flow of air for this case is not illustrated in FIG. 15, when the railway vehicle 410 is traveling in the X2 direction, the air exhausted outwards (in the Y2 direction) from the outlet 443 is redirected into the X1 direction, and then this redirected air is reliably supplied to the movement direction-side ends 431c of the radiating fins 431.

In the power converter 600 according to Embodiment 6, the configuration of the power converter 300 of Embodiment 3, in which the heat sink unit 330 is arranged beneath the semiconductor device 20, is replaced by a configuration in which the heat sink unit 630 is arranged on the side of a semiconductor device 420. Therefore, the rest of the configuration of the power converter 600 according to Embodiment 6 is the same as the configuration of the power converter 300 according to Embodiment 3 except in that the Y axis direction and the Z axis direction are respectively switched with the Z axis direction and the Y axis direction.

(Effects of Embodiment 6)

As described above, in Embodiment 6 the heat sink unit 630 includes the air-guiding member 650, which guides air that is exhausted through the outlet 443 into the space S4 on the side on which the fins 431a (and 432a) are formed towards the movement direction-side ends 431c (or 432c) of the radiating fins 431 or 432. This makes it possible to use the air-guiding member 650 to efficiently and reliably guide the airflow (fresh outside air) to the movement direction-side ends 431c (or 432c) of the fins 431a (or 432a), depending on which are currently rearward (downstream) according to the movement direction of a railway vehicle 410. Moreover, in Embodiment 6, the radiating fins 431 and 432 are mounted on the side (the Y2 side) of the semiconductor device 420, and therefore the radiating fins 431 and 432 are exposed on the side (the Y2 side) of the railway vehicle 410 while the railway vehicle 410 is moving. This makes it possible to take in an airflow that is less turbulent than when taking in fresh outside air from beneath the railway vehicle 410 (where other devices or the like may be attached), thereby making it possible for the radiating fins 431 and 432 to easily take in fresh outside air from the side (the Y2 side) of the railway vehicle 410. This, in turn, makes it possible to further improve the heat sink performance (heat dissipation performance) of the heat sink unit 630. The rest of the effects of Embodiment 6 are the same as in Embodiment 3.

Modification Examples

The embodiments described above are only examples in all respects and do not limit the present invention in any way. The scope of the present invention is defined by the claims, not by the descriptions of the embodiments above. Furthermore, the scope of the present invention also includes all changes (modification examples) included within the scope of the claims or their equivalents.

For example, in Embodiments 1 to 6 as described above, the present invention was applied to the power converters 100, 200, 300, 400, 500, and 600 that were mounted in the underfloor space 11a of the vehicle body 11. However, the present invention is not limited to this example. The present invention may also be applied to power converters that are mounted on the roof of the vehicle body 11, for example.

Moreover, although a single slit-shaped outlet 43 was formed in the bottom surface 42a of the duct 42 in Embodiment 1, the present invention is not limited to this example. In other words, a plurality of shorter outlets 43 may be formed separately from one another at a prescribed interval. In this case, the plurality of outlets 43 may be round holes or polygonal holes (such as rectangular holes). This makes it possible to adjust parameters such as the number and positioning of the outlets 43 in accordance with the length of the duct 42 that extends through the space S, thereby making it possible to shape the flow pattern of the airflow (fresh outside air) that is exhausted into the space S from the outlets 43 to have a desired shape.

Moreover, although a single slit-shaped outlet 443 was formed in the side face 442a of the duct 442 in Embodiments 4 to 6, the present invention is not limited to this example. In other words, a plurality of shorter outlets 443 may be formed separately from one another at a prescribed interval. In this case, the plurality of outlets 443 may be round holes or polygonal holes (such as rectangular holes). This makes it possible to adjust parameters such as the number and positioning of the outlets 443 in accordance with the length of the duct 442 that extends through the space S4, thereby making it possible to shape the flow pattern of the airflow (fresh outside air) that is exhausted into the space S4 from the outlets 443 to have a desired shape.

Furthermore, although the duct 42 (and 442) was configured to have a rectangular cross-sectional shape in Embodiments 1 to 6 as described above, the present invention is not limited to this example. The "air duct" of the present invention may instead be configured using a duct 42 (or 442) that has a circular cross-sectional shape, for example.

In addition, although the height of the duct 42 was configured to be equal to the height H1 of the bases 35 and 36 in Embodiments 1 to 3, the present invention is not limited to this example. The height of the duct 42 may instead be slightly less than the height H1, for example.

Moreover, although the length of the duct 442 was configured to be equal to the length H41 of the bases 435 and 436 in the Y axis direction in Embodiments 4 to 6, the present invention is not limited to this example. The length of the duct 442 may instead be slightly less than the length H41 in the Y axis direction, for example.

Furthermore, although the radiating fins 431 and 432 and the air duct 440 (or 540) were arranged on the side face on one side (the Y2 side) of the semiconductor device 420 in Embodiments 4 to 6 as described above, the present invention is not limited to this example. The radiating fins 431 and 432 and the air duct 440 (or 540) may instead be arranged on the side face on the other side (the Y1 side) of the semiconductor device 420. Alternatively, the radiating fins 431 and 432 and the air duct 440 (or 540) may be arranged on the side faces on both sides of the semiconductor device 420.

In addition, although the radiating fins 31 and 32 and the air duct 40 (or 240) were arranged on the bottom surface of the semiconductor device 20 in Embodiments 1 to 3 as described above, and the radiating fins 431 and 432 and the air duct 440 (540) were arranged on the side face of the semiconductor device 420 in Embodiments 4 to 6, the present invention is not limited to these examples. The plurality of radiating fins may be arranged both on the bottom surface and on the side faces of the main power converter unit.

Moreover, in Embodiments 1 to 6 as described above, the present invention was applied to the power converters 100, 200, 300, 400, 500, and 600 for the overhead line-type electric railway vehicle 10 (or 410) that is driven using power from the overhead line 2. However, the present invention is not limited to this example. The present invention may also be applied to a power converter for a third rail-type railway vehicle 10 (or 410) in which a third rail for supplying power is arranged separately but parallel to the running rails and a collector shoe arranged on the vehicle body 11 side contacts the third rail and collects power therefrom.

Moreover, in Embodiments 1 to 6 as described above, the present invention was applied to the power converters 100, 200, 300, 400, 500, and 600 for the overhead line-type electric railway vehicle 10 (or 410) that is driven using power from the overhead line 2. However, the present invention is not limited to this example. In other words, the present invention may also be applied to heat sink equipment in a diesel railcar in which a diesel engine is used as a direct source of driving power or to dissipate heat from a power converter for a railway vehicle 10 (or 410) in a diesel-electric railcar or the like in which a diesel engine is used to generate power for rotating the induction motors 14.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A power converter for a railway vehicle, comprising:
a power converter body configured to be installed on the railway vehicle;
a first radiating fin unit arranged on a front side with respect to a movement direction of the railway vehicle on the power converter body, the first radiating fin unit having a plurality of fins each extending in said movement direction and dissipating heat from the power converter body;
a second radiating fin unit arranged on the power converter body on a rear side, separated from the first radiating fin unit by a prescribed distance, the second radiating fin unit having a plurality of fins each extending in said movement direction and dissipating heat from the power converter body; and
an air duct that takes in air from a region other than regions in which the first and second radiating fin units are disposed while the railway vehicle is moving, the air duct extending into a fin separation space that is defined as a space between the first radiating fin unit and the second radiating fin unit so as to guide air that is taken in into the fin separation space,
wherein the first radiating fin unit and the second radiating fin unit each include a base fixed to a surface of the power converter body, said base supporting and attaching edges of the respective plurality of fins,
wherein the air duct includes, in the fin separation space, a duct that has an elongated shape with a height lower than or equal to a height of the respective bases, said duct having an opening that creates an outlet in a surface of the duct so as to exhaust air in the duct outwardly into the fin separation space, and
wherein in the fin separation space, the duct extends in a direction that is orthogonal to the movement direction.

2. The power converter according to claim 1, wherein the duct is attached to a portion of the surface of the power converter body to which the respective bases are fixed.

3. The power converter according to claim 1, wherein the outlet in the duct substantially spans from one end of the fin separation space to another end of the fin separation space in a direction that is orthogonal to the movement direction and that is parallel to said surface of the power converter body to which the respective bases are fixed.

4. The power converter according to claim 1, wherein the outlet is slit-shaped and extends in a direction in which the duct extends.

5. The power converter according to claim 1, wherein the outlet is formed of a plurality of slits that are arranged in a direction in which the duct extends and that are separated from one another by a prescribed interval.

6. The power converter according to claim 1, further comprising:
an air-guiding plate configured so as to guide air that is exhausted through the outlet into the fin separation space towards a lateral end of the first radiating fin unit or the second radiating fin unit that is adjacent to the outlet.

7. The power converter according to claim 1,
wherein the air duct further includes an inlet that takes in air from a space that is located outside of the fin separation space, and
wherein air that enters the inlet is guided into the duct, travels through the duct, and is then exhausted through the outlet outwardly into the fin separation space in a direction in which the respective plurality of fins extend from the respective bases.

8. The power converter according to claim 7,
wherein the air duct includes two of said inlet that are a first inlet and a second inlet, the first inlet being configured to take in an airflow when the railway vehicle is traveling in said movement direction with the first radiating fin unit placed on the front side relative to the second radiating fin unit, the second inlet being configured to take in an airflow when the railway vehicle is traveling in a reversed direction opposite to said movement direction with the second radiating fin unit placed on a front side relative to the reversed direction, and
wherein the air duct further includes an air-guiding plate or plates configured to guide air taken in by the first inlet or the second inlet, depending on a movement direction of the railway vehicle, into the duct.

9. A power converter for a railway vehicle, comprising:
a power converter body configured to be installed on the railway vehicle;
a first radiating fin unit arranged on a front side with respect to a movement direction of the railway vehicle on the power converter body, the first radiating fin unit having a plurality of fins each extending in said movement direction and dissipating heat from the power converter body;
a second radiating fin unit arranged on the power converter body on a rear side, separated from the first radiating fin unit by a prescribed distance, the second radiating fin unit having a plurality of fins each extending in said movement direction and dissipating heat from the power converter body; and
an air duct that takes in air from a region other than regions in which the first and second radiating fin units are disposed while the railway vehicle is moving, the air duct extending into a fin separation space that is defined as a space between the first radiating fin unit and the second radiating fin unit so as to guide air that is taken in into the fin separation space,
wherein the air duct is formed spanning from an outer space that is located outside the fin separation space on one side of the fin separation space in a direction orthogonal to the movement direction to another outer space that is outside of the fin separation space on an opposite side.

10. The power converter according to claim 9,
wherein the air duct has inlets on respective sides of the fin separation space, respectively opening to said outer space and said another outer space so as to take in air from said outer space and said another outer space, respectively.

11. The power converter according to claim 10,
wherein the inlets are provided on respective surfaces of the power converter body that are located outside of the fin separation space,
wherein the first radiating fin unit and the second radiating fin unit each include a base fixed to a surface of the power converter body, said base supporting edges of the respective plurality of fins,
wherein the air duct includes, in the fin separation space, a duct that has an elongated shape with a height lower than or equal to a height of the respective bases, and
wherein air that flows along said respective surfaces of the power converter body while the railway vehicle is moving is taken in via the respective inlets, and air that is taken in via the inlets is guided into said duct.

12. The power converter according to claim 11, wherein lengths of the inlets along directions parallel to the respective surfaces on which the inlets are provided is greater than said height of the duct.

13. The power converter according to claim 1, wherein the air duct has a shape that is line-symmetric about a center line running through the fin separation space in a direction that is orthogonal to the movement direction.

14. The power converter according to claim 1, wherein the air duct has a shape that is line-symmetric about a center line parallel to the movement direction.

15. A power converter for a railway vehicle, comprising:
a power converter body configured to be installed on the railway vehicle;
a first radiating fin unit arranged on a front side with respect to a movement direction of the railway vehicle on the power converter body, the first radiating fin unit having a plurality of fins each extending in said movement direction and dissipating heat from the power converter body;
a second radiating fin unit arranged on the power converter body on a rear side, separated from the first radiating fin unit by a prescribed distance, the second radiating fin unit having a plurality of fins each extending in said movement direction and dissipating heat from the power converter body; and
an air duct that takes in air from a region other than regions in which the first and second radiating fin units are disposed while the railway vehicle is moving, the air duct extending into a fin separation space that is defined as a space between the first radiating fin unit and the second radiating fin unit so as to guide air that is taken in into the fin separation space,
wherein the first radiating fin unit and the second radiating fin unit each include a base fixed to a surface of the power converter body, said base supporting and attaching edges of the respective plurality of fins,
wherein the air duct includes, in the fin separation space, a duct that has an elongated shape with a height lower than or equal to a height of the respective bases, said duct having an opening that creates an outlet in a surface of the duct so as to exhaust air in the duct outwardly into the fin separation space, and
wherein in the fin separation space, the duct is configured to extend in a railway tie direction that is orthogonal to the movement direction.

16. The power converter according to claim 15,
wherein the power converter body is configured to be mounted in an underfloor space of the railway vehicle,
wherein said surface of the power converter body to which the first radiating fin unit and the second radiating fin unit are attached is a bottom surface of the power converter body,
wherein the air duct is attached along said bottom surface of the power converter body to which the first radiating fin unit and the second radiating fin unit are fixed, and
wherein the air duct is configured to guide air that is taken in from a position near the bottom surface of the power converter body or from a position further away than said position near the bottom surface while the railway vehicle is moving into the fin separation space and to then exhaust the air towards a lateral end of the first radiating fin unit or the second radiating fin unit.

17. A power converter for a railway vehicle, comprising:
a power converter body configured to be installed on the railway vehicle;
a first radiating fin unit arranged on a front side with respect to a movement direction of the railway vehicle on the power converter body, the first radiating fin unit having a plurality of fins each extending in said movement direction and dissipating heat from the power converter body;
a second radiating fin unit arranged on the power converter body on a rear side, separated from the first radiating fin unit by a prescribed distance, the second radiating fin unit having a plurality of fins each extending in said movement direction and dissipating heat from the power converter body; and
an air duct that takes in air from a region other than regions in which the first and second radiating fin units are disposed while the railway vehicle is moving, the air duct extending into a fin separation space that is defined as a space between the first radiating fin unit and the second radiating fin unit so as to guide air that is taken in into the fin separation space,
wherein the first radiating fin unit and the second radiating fin unit each include a base fixed to a surface of the power converter body, said base supporting and attaching edges of the respective plurality of fins,
wherein the air duct includes, in the fin separation space, a duct that has an elongated shape with a height lower than or equal to a height of the respective bases, said duct having an opening that creates an outlet in a surface of the duct so as to exhaust air in the duct outwardly into the fin separation space, and
wherein in the fin separation space, the duct is configured to extend in a vertical direction of the railway vehicle that is orthogonal to the movement direction.

18. The power converter according to claim 17,
wherein the power converter body is configured to be mounted in an underfloor space of the railway vehicle,
wherein said surface of the power converter body to which the first radiating fin unit and the second radiating fin unit are attached is a side face of the power converter body,
wherein the air duct is attached along said side face of the power converter body to which the first radiating fin unit and the second radiating fin unit are fixed, and
wherein the air duct is configured to guide air that is taken in from a position near said side face of the power converter body or from a position further away than said position near said side face while the railway vehicle is moving into the fin separation space and to then exhaust the air towards a lateral end of the first radiating fin unit or the second radiating fin unit.

* * * * *